United States Patent
Ichige et al.

(10) Patent No.: US 7,411,826 B2
(45) Date of Patent: *Aug. 12, 2008

(54) SEMICONDUCTOR INTEGRATED CIRCUIT DEVICE

(75) Inventors: Masayuki Ichige, Yokohama (JP); Riichiro Shirota, Fujisawa (JP); Kikuko Sugimae, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/480,460

(22) Filed: Jul. 5, 2006

(65) Prior Publication Data

US 2006/0250849 A1    Nov. 9, 2006

Related U.S. Application Data

(60) Continuation of application No. 11/108,634, filed on Apr. 19, 2005, now Pat. No. 7,082,055, which is a division of application No. 10/256,102, filed on Sep. 27, 2002, now Pat. No. 6,925,008.

(30) Foreign Application Priority Data

Sep. 29, 2001 (JP) ............................. 2001-375007
Dec. 17, 2001 (JP) ............................. 2001-383553

(51) Int. Cl.
  *G11C 16/04* (2006.01)
(52) U.S. Cl. ..................... 365/185.17; 365/185.05; 365/185.33
(58) Field of Classification Search ............ 365/185.17, 365/185.12, 185.13, 185.05, 185.28, 185.33
See application file for complete search history.

(56) References Cited

U.S. PATENT DOCUMENTS

| | | | | | |
|---|---|---|---|---|---|
| 5,805,498 | A | * | 9/1998 | Lee et al. ............... | 365/185.17 |
| 5,966,326 | A | * | 10/1999 | Park et al. .............. | 365/185.11 |
| 6,307,807 | B1 | | 10/2001 | Sakui et al. | |
| 6,326,661 | B1 | | 12/2001 | Dormans et al. | |
| 6,370,081 | B1 | | 4/2002 | Sakui et al. | |
| 6,400,604 | B2 | | 6/2002 | Noda | |
| 6,678,191 | B2 | * | 1/2004 | Lee et al. ............... | 365/185.17 |

(Continued)

FOREIGN PATENT DOCUMENTS

JP         63-205964         8/1988

(Continued)

OTHER PUBLICATIONS

R. Shirota, NVSMW, pp. 22-31, "A Review of 256Mbit NAND Flash Memories and NAND Flash Future Trend", 2000.

(Continued)

*Primary Examiner*—Gene N. Auduong
(74) *Attorney, Agent, or Firm*—Oblon, Spivak, McClelland, Maier & Neustadt, P.C.

(57) ABSTRACT

A semiconductor integrated circuit device includes a semiconductor substrate, an element isolation region, a first interconnection, a second interconnection, and a memory cell unit connected between a corresponding one of the first interconnection and a second interconnection. The memory cell unit includes two selection transistors and memory cell transistors of not larger than two. The memory cell transistors are connected between the two selection transistors. The memory cell transistor has a charge storage layer whose side surface lies in the same plane or in substantially the same plane as the side surface of the element isolation regions.

12 Claims, 27 Drawing Sheets

U.S. PATENT DOCUMENTS

| | | |
|---|---|---|
| 6,788,573 B2 | 9/2004 | Choi |
| 6,878,985 B2 | 4/2005 | Arai et al. |
| 6,925,008 B2 * | 8/2005 | Ichige et al. ........... 365/185.17 |
| 7,082,055 B2 * | 7/2006 | Ichige et al. ........... 365/185.17 |
| 2005/0056869 A1 | 3/2005 | Ichige et al. |

FOREIGN PATENT DOCUMENTS

| | | |
|---|---|---|
| JP | 7-106447 | 4/1995 |
| JP | 10-134588 | 5/1998 |
| JP | 10-335497 | 12/1998 |
| JP | 11-261038 | 9/1999 |
| JP | 2000-149581 | 5/2000 |
| JP | 2000-269361 | 9/2000 |

OTHER PUBLICATIONS

K. Imamiya, et al., NVSMW, pp. 78-80, "32kbyte three-transistor flash for embedded applications using 0.4 μm NAND flash technology", 2000.

G. Tao, et al., NVSMW, pp. 130-132, "Reliability aspects of advanced embedded floating-gate non-volatile memories with uniform channel FN turnneling for both program and erase", 2001.

S. Aritome, et al., IEDM, pp. 61-64, "A 0.67um$^2$ Self-Aligned Shallow Trench Isolation Cell(SA-STI Cell) for 3V-only 256Mbit NAND EEPROMs", 1994.

* cited by examiner

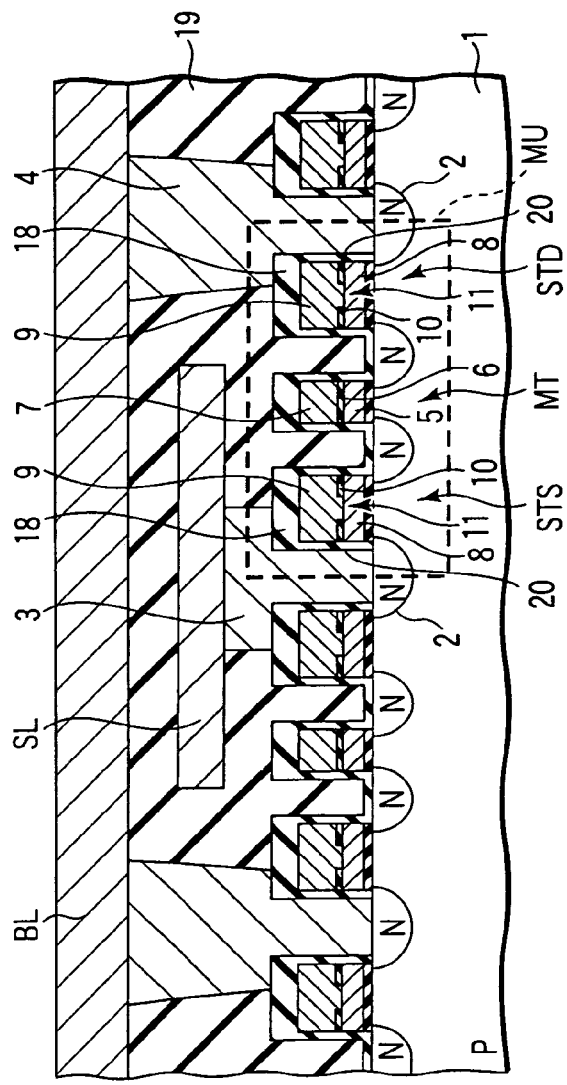
F I G. 2A
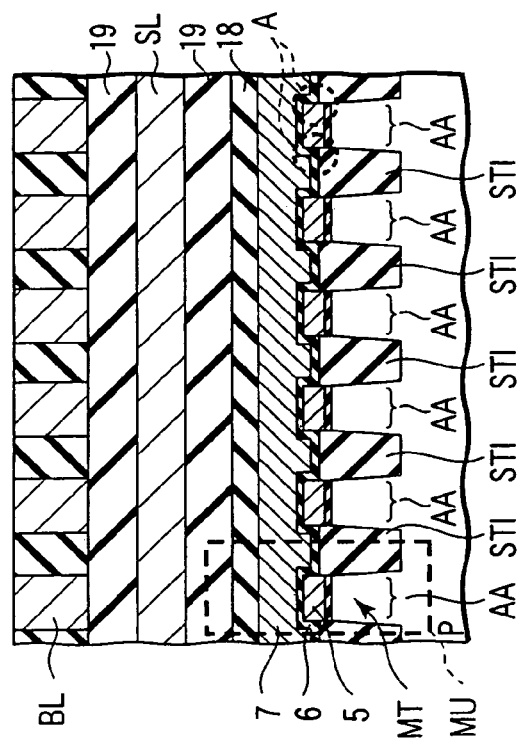
F I G. 2B

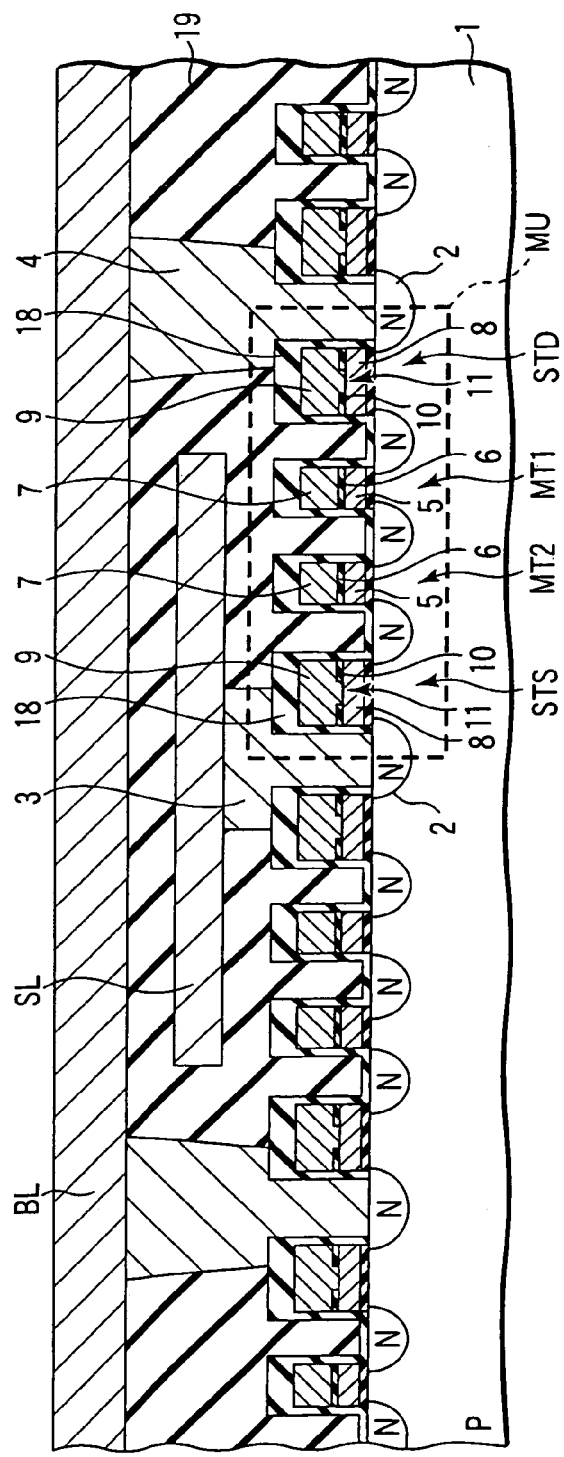
F I G. 5A
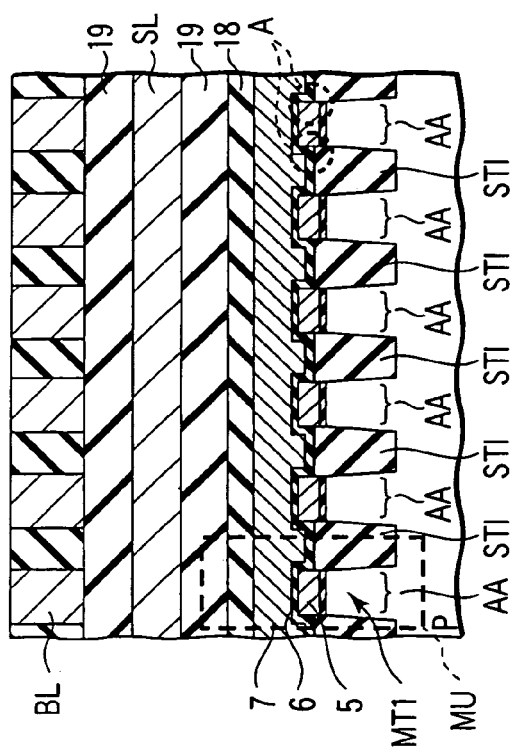
F I G. 5B

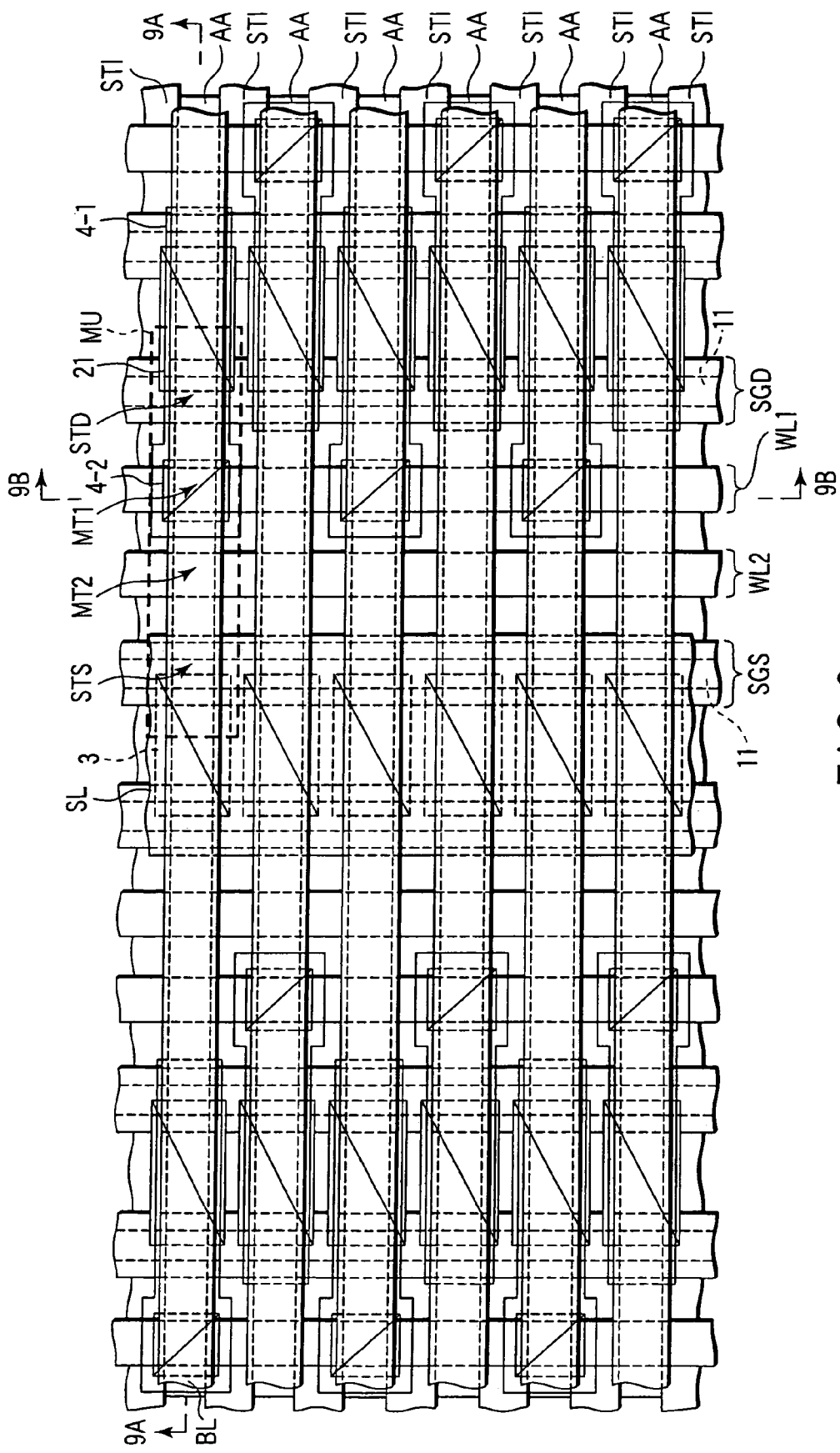
F I G. 8

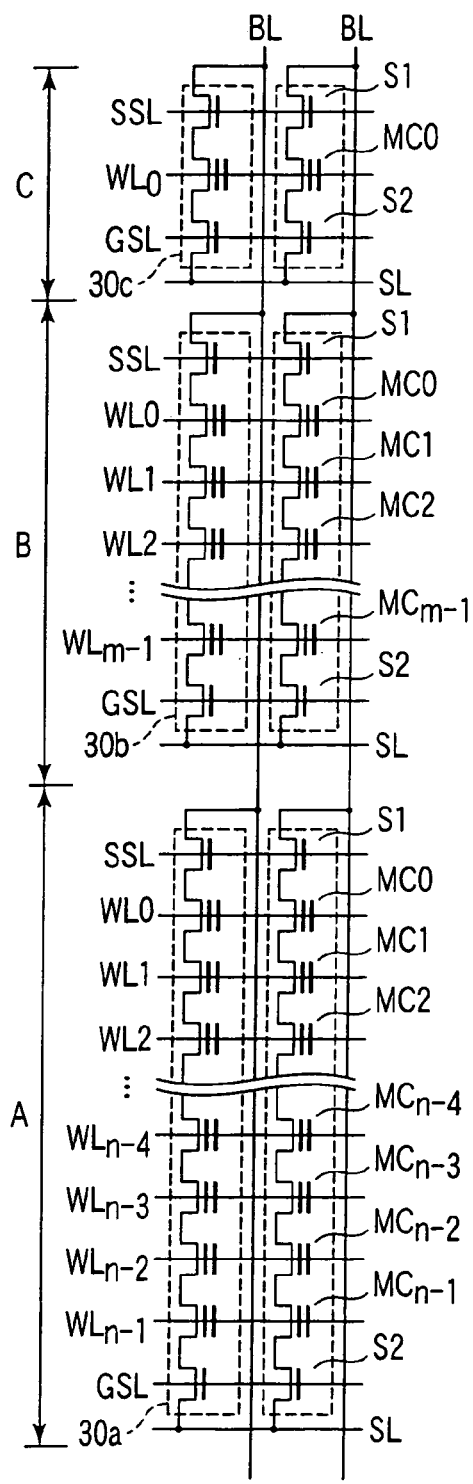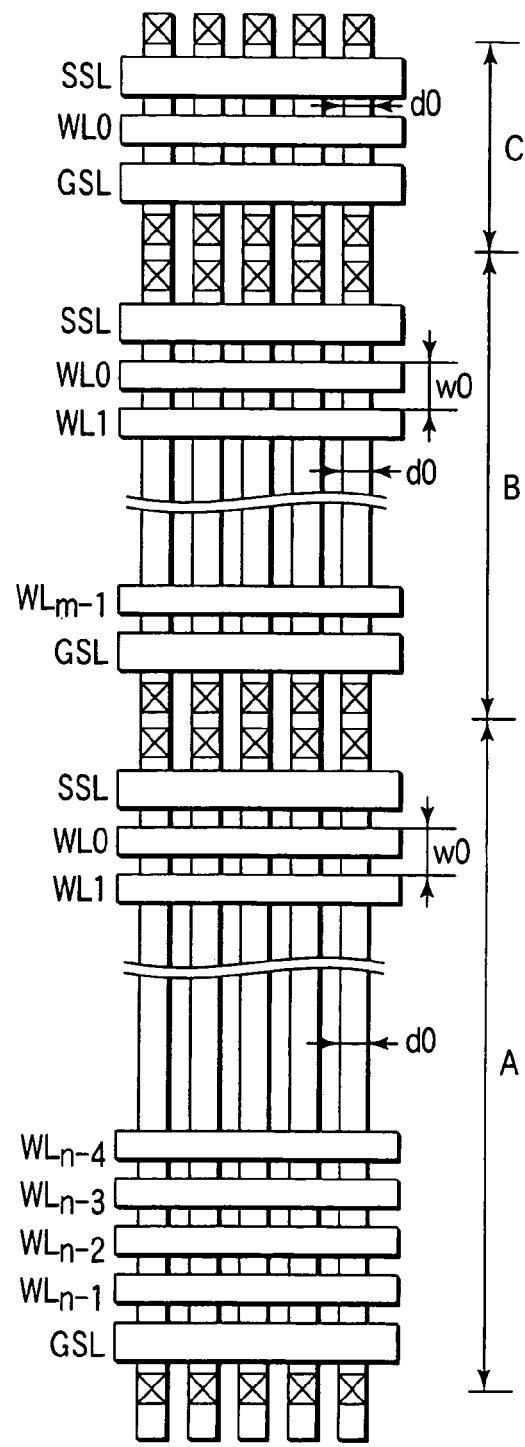
F I G. 15A　　　　F I G. 15B

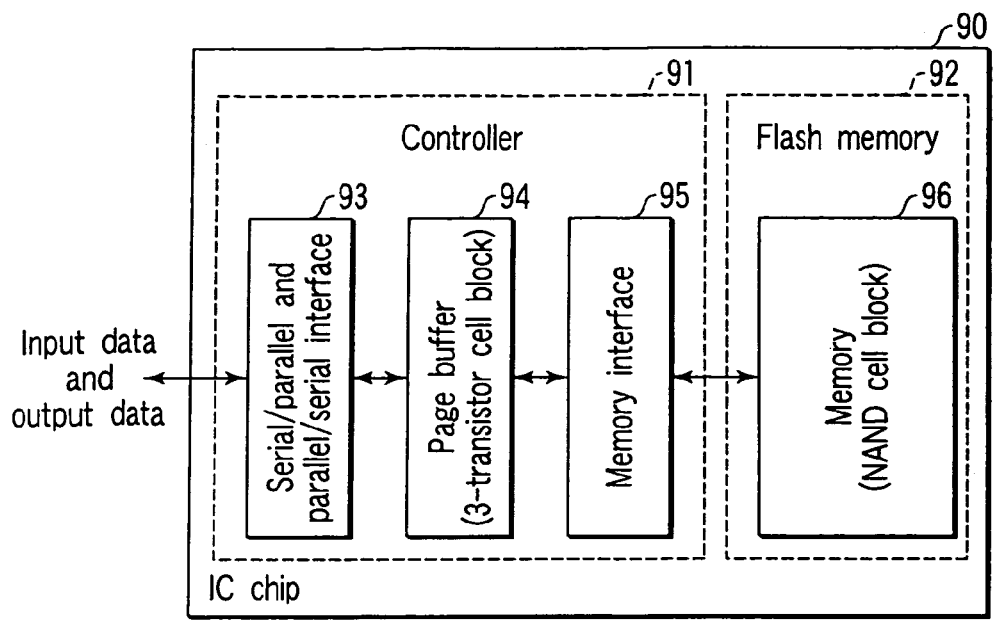
F I G. 26A
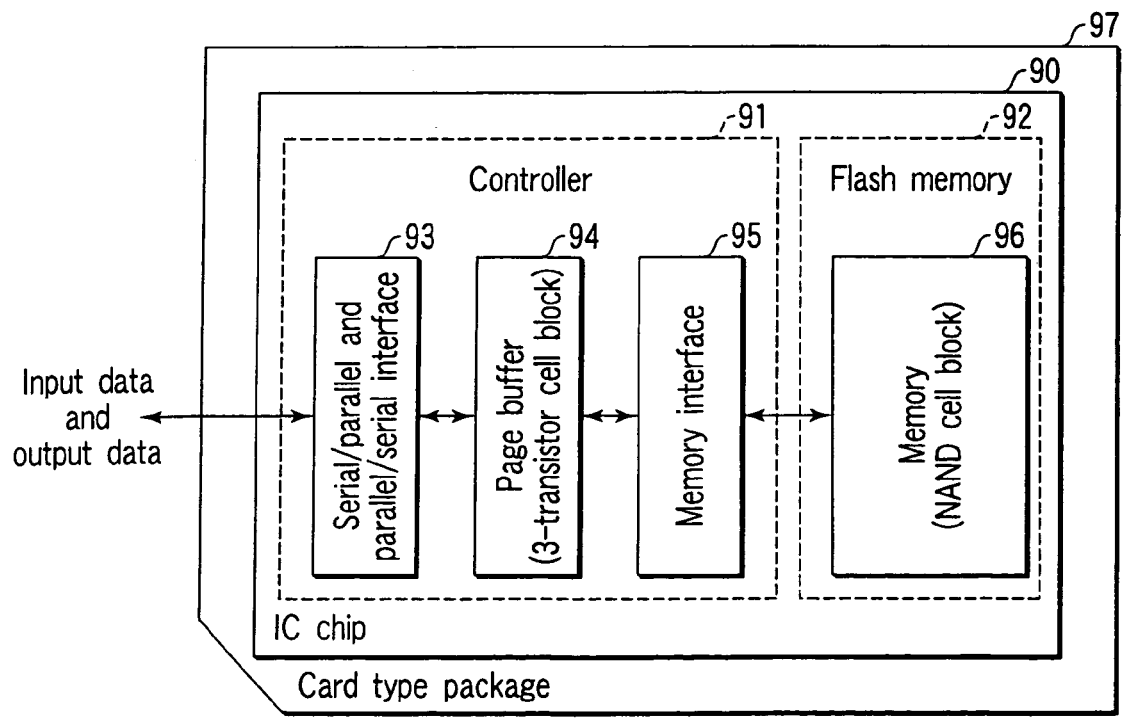
F I G. 27

SEMICONDUCTOR INTEGRATED CIRCUIT DEVICE

CROSS-REFERENCE TO RELATED APPLICATIONS

This application is a continuation of U.S. patent application Ser. No. 11/108,634, filed Apr. 19, 2005, which is a divisional of U.S. application Ser. No. 10/256,102, filed Sep. 27, 2002, which is based upon and claims the benefit of priority from the prior Japanese Patent Applications No. 2001-375007, filed Sep. 29, 2001; and No. 2001-383553, filed Dec. 17, 2001, the entire contents of which are incorporated herein by reference.

BACKGROUND OF THE INVENTION

1. Field of the Invention

This invention relates to a semiconductor integrated circuit device and more particularly to a semiconductor integrated circuit device containing non-volatile memory transistors.

2. Description of the Related Art

A representative memory cell used in a non-volatile semiconductor memory device such as a NAND flash memory is described in a document 1 (R. Shirota).

In the document 1, the details of the development of products of 256-Mbit NAND flash memories using an STI (Shallow Trench Isolation) structure, particularly, for element isolation is described.

The memory cell unit described in the document 1 has a structure in which selection transistors are arranged on both sides of a plurality of series-connected memory cell transistors. The plurality of memory cell transistors are formed in respective element active regions. The element active regions are separated by element isolation regions such as STI regions and the element active regions and STI regions are formed to extend in parallel so as to configure a memory cell array.

Part of the floating gate layer of the memory cell transistor is formed to cover the STI region. The volume of the covering part contributes to an increase in the ratio of the capacitance between the floating gate layer and the channel region to the capacitance between the floating gate layer and the control gate layer, that is, a so-called "coupling ratio".

In order to form the above memory cell transistor, it is necessary to form an extremely narrow slit-form pattern or so-called "slits" in the conductor layer used as part of the floating gate layer. FIG. 28 shows a step in which slits 103 are formed.

As shown in FIG. 28, conductive layers 104 are conductive material layers used as parts of the floating gate layers of memory cell transistors and the gates of selection transistors. Each of the slits 103 is formed in parallel with the STI region in a portion of the conductive layer 104 which lies on the STI region. The width of the slit is smaller than that of the STI region. By forming the slits 103 in the conductive layers 104, it becomes possible to separate the floating gate layers for the respective memory cell transistors.

In a normal NAND flash memory, memory cells are miniaturized by serially connecting a plurality of memory cell transistors and reducing the number of contacts between bit lines and memory cell units.

However, as shown in FIG. 29, if the number of memory cell transistors is reduced to as a small number as one or two, the distance $D_{SG-SG}$ between the gates of the selection transistors is relatively narrowed. If the distance $D_{SG-SG}$ is relatively narrowed, it becomes difficult to form the slits 103 in the conductive layers 104.

According to the document 1, it is described that the process of forming a region which is narrower than a region patterned by lithography can be realized by so-called spacer processing.

However, if the distance $D_{SG-SG}$ is narrowed, it becomes difficult to form the slit 103 having width sufficiently larger than the width of the element isolation region required in the memory cell unit when taking the processing conversion difference or the like into consideration. Further, when the width of the STI region and the width of the element activation region AA are determined based on the minimum processing dimension, it is difficult to form the slits 103 by use of a patterning process by exposure.

A case wherein the number of memory cell transistors in the memory cell unit is reduced is described in a document 2 (K. Imamiya, et al.), document 3 (Jpn. Pat. Appln. KOKAI Publication No. 2000-149581 (Sakui, et al.) and document 4 (G. Tao, et al.), for example.

In the document 2, for example, utilization of a memory cell transistor is reported when one memory cell transistor is provided. It is an EEPROM using a so-called three-transistor cell unit. In such a flash memory, the process for miniaturizing the same tends to be influenced by the above-described problems.

Therefore, as described in a document 5 (S. Aritome, et al.), a method of forming a floating gate layer in self-alignment with an STI region is proposed.

However, as described in the document 5, if the floating gate layer is formed in self-alignment with the STI region, portions used as parts of the gate layers of the selection transistors may be separated for each selection transistor like the portions used as the floating gates of the memory cell transistors.

(Reference Documents)

1. R. Shirota, "A Review of 256 Mbit NAND Flash Memories and NAND Flash Future Trend", Non-Volatile Semiconductor Memory Workshop (=NVSMW) 2000 pp 22-31.

2. K. Imamiya, et al., "32 kbyte three-transistor flash for embedded applications using 0.4 µm NAND flash technology", Non-Volatile Semiconductor Memory Workshop (=NVSMW) 2000 pp 78-80.

3. Jpn. Pat. Appln. KOKAI Publication No. 2000-149581. (U.S. Pat. No. 6,307,807 B1.)

4. G. Tao, et al., "Reliability aspect of embedded floating-gate non-volatile memories with uniform channel FN tunneling for both program", Non-Volatile Semiconductor Memory Workshop (=NVSMW) 2001 pp 130-132.

5. S. Aritome, et al., "A 0.67 µm 2 SELF-ALIGNED SHALLOW TRENCH ISOLATION CELL (SA-STI CELL) FOR 3V-only 256 Mbit NAND EEPROMs" IEDM (1994) pp 61-64.

BRIEF SUMMARY OF THE INVENTION

A semiconductor integrated circuit device according to a first aspect of the present invention comprises: a semiconductor substrate; an element isolation region formed on the semiconductor substrate to separately define an element active region on the semiconductor substrate; a first interconnection; a second interconnection; and a memory cell unit formed in the element active region and connected between the first interconnection and the second interconnection, the memory cell unit including two selection transistors and memory cell transistors of not larger than two which are connected between the two selection transistors, the memory cell transistors having a charge storage layer whose side surface lies in the same plane or in substantially the same plane as a side surface of the element isolation region.

A semiconductor integrated circuit device according to a second aspect of the present invention comprises: a semiconductor substrate; an element isolation region formed on the semiconductor substrate to separately define an element active region on the semiconductor substrate; a first interconnection; a second interconnection; and a memory cell unit formed in the element active region and connected between the first interconnection and the second interconnection, the memory cell unit including one selection transistor and one memory cell transistor which make one pair, the memory cell transistor having a charge storage layer whose side surface lies in the same plane or in substantially the same plane as a side surface of the element isolation region.

A semiconductor integrated circuit device according to a third aspect of the present invention comprises: a memory cell array; a first cell block provided in the memory cell array, a plurality of memory cell strings each of which is configured by a plurality of electrically rewritable memory cells and at least one selection transistor which are serially connected being arranged in the first cell block; and a second cell block provided in the memory cell array, a plurality of memory cell strings each of which is configured by a plurality of electrically rewritable memory cells different in number from those of the first cell block and at least one selection transistor which are serially connected being arranged in the second cell block.

A semiconductor integrated circuit device according to a fourth aspect of the present invention comprises: a memory circuit having a nonvolatile semiconductor memory cell array; and a controlling circuit which controls the memory circuit and having a page buffer, the page buffer including a three-transistor cell block or a two-transistor cell block.

BRIEF DESCRIPTION OF THE SEVERAL VIEWS OF THE DRAWING

FIG. 2A is a cross sectional view taken along the 2A-2A line of FIG. 1 and FIG. 2B is a cross sectional view taken along the 2B-2B line of FIG. 1;

FIG. 5A is a cross sectional view taken along the 5A-5A line of FIG. 4 and FIG. 5B is a cross sectional view taken along the 5B-5B line of FIG. 4;

FIG. 8 is a plan view showing one example of a plane pattern of a non-volatile semiconductor memory device according to a fourth embodiment of the present invention;

FIG. 15A is an equivalent circuit diagram showing one equivalent circuit example of a memory cell array of a non-volatile semiconductor memory device according to a seventh embodiment of the present invention;

FIG. 15B is a plan view showing one layout example of a memory cell array of a NAND EEPROM according to the seventh embodiment of the present invention;

FIG. 26A is a block diagram showing a non-volatile semiconductor memory device according to a first example of an eighth embodiment of the present invention;

FIG. 27 is a block diagram showing an IC card example according to the embodiment of the present invention;

DETAILED DESCRIPTION OF THE INVENTION

There will now be described embodiments of this invention with reference to the accompanying drawings. In the explanation, common portions are denoted by the same reference symbols throughout the drawings.

First Embodiment

As a method for connecting portions used as gate layers separated for each selection transistor to one another in order to form a selection gate line, a method for connecting the portions used as the gate layers separated for each selection transistor to one another, for example, by utilizing conductor layers used as portions of the floating gate layers of the memory cell transistors or conductive layers used as the control gate layers thereof is considered.

One example of a method for forming such a contact is a method for forming a conductor layer used as part of the floating gate layer of the memory cell transistor to extend onto the STI region in a portion where the selection transistor is formed and forming a contact on the STI region (reference document 6).

Reference Document 6:

Japanese Patent Application No. 2000-301380, filed Sep. 29, 2000.

U.S. patent application Ser. No. 09/916,595, filed Jul. 30, 2001. (Publication No. US-2002-0038877.)

The entire contents of U.S. patent application Ser. No. 09/916,595 are incorporated herein by reference.

Further, another example of the above method is a method for forming a contact for a conductor layer used as part of the gate layer of the selection transistor and short-circuiting the above conductive layer to a conductor layer used as the control gate layer of the memory cell transistor to form a contact on an element active region AA (reference document 7).

Reference Document 7:

Japanese Patent Application No. 2000-291910, filed Sep. 26, 2000.

U.S. patent application Ser. No. 09/956,986, filed Sep. 21, 2001. (Publication No. US-2002-0036317).

The entire contents of U.S. patent application Ser. No. 09/956,986 are incorporated herein by reference.

Figure 1:
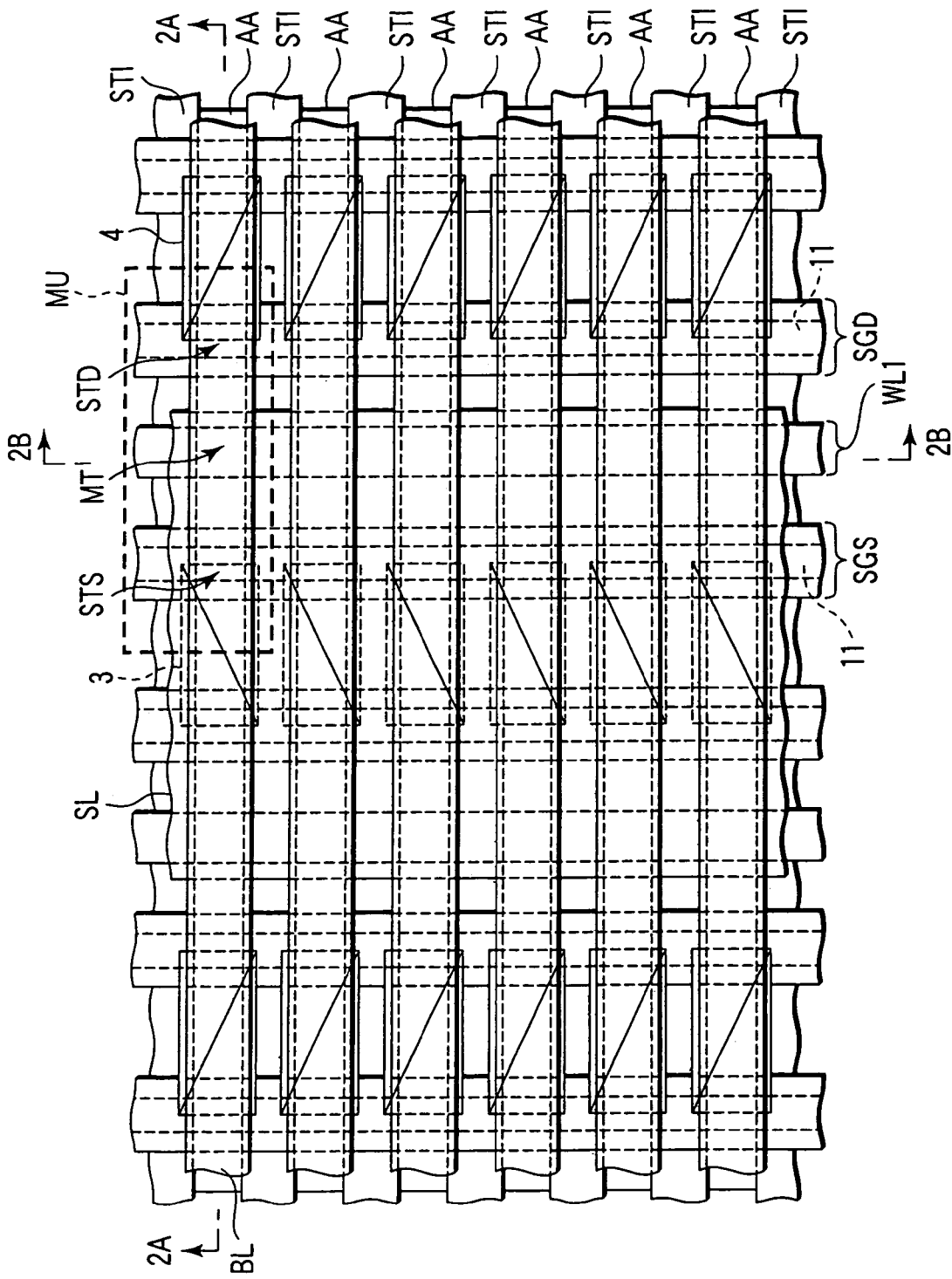
FIG. 1 is a plan view showing one example of a plane pattern of a non-volatile semiconductor memory device according to a first embodiment of the present invention.

FIG. 1 is a plan view showing one example of a plane pattern of a non-volatile semiconductor memory device according to a first embodiment of the present invention, FIG. 2A is a cross sectional view taken along the 2A-2A line of FIG. 1 and FIG. 2B is a cross sectional view taken along the 2B-2B line of FIG. 1.

As shown in FIGS. 1, 2A, 2B, element isolation regions STI are formed on a semiconductor substrate, for example, a P-type silicon substrate or a P-type well 1. The element isolation regions STI separate or isolate the element active regions AA on the P-type well 1. In the example shown in FIG. 1, the STI regions are formed in a stripe form to isolate the stripe-form element active regions AA on the surface of the P-type well 1. Memory cell units MU are formed in the element active regions AA.

The memory cell unit MU in the first embodiment is a so-called three-transistor cell unit. The three-transistor cell unit includes a source-side selection transistor STS, drain-side selection transistor STD and one memory cell transistor MT connected between the selection transistors STS and STD.

An N-type source/drain diffusion layer 2 of the source-side selection transistor STS is connected to a common source line SL via a contact 3. Further, an N-type source/drain diffusion layer 2 of the drain-side selection transistor STD is connected to a data line or bit line BL via a contact 4. Thus, the memory cell unit MU is connected between the source line SL and the data line or bit line BL.

For example, the common source line SL is formed to extend in a direction perpendicular to the extending direction of the element active region AA and element isolation region STI. For example, the common source line SL is formed of a first-layered metal inter-connection layer which is formed above the gate electrodes of the transistors STS, STD, and MT. The common source line SL in the present example is formed to extend from above the gate electrodes of the selection transistors STS, STD over to a portion above the gate electrode of the memory cell transistor MT, for example.

For example, the bit line BL is formed to extend in the extending direction of the element active region AA and element isolation region STI. For example, the bit line BL is formed of a second-layered metal interconnection layer which is formed above the common source liner SL.

The memory cell transistor MT includes a charge storage layer, for example, a floating gate electrode 5. For example, as shown by circles A of broken lines in FIG. 2B, the side surfaces of the floating gate electrode 5 of the present example lie in the same plane or substantially in the same plane as the side surfaces of the respective element isolation regions STI.

A control gate layer 7 is formed on each floating gate layer 5 with a gate-gate insulating film 6 disposed therebetween. Each control gate layer 7 functions as a word line WL. For example, the gate-gate insulating film 6 is configured by an insulating film having a three-layered structure of a silicon oxide film, silicon nitride film and silicon oxide film or the like. Generally, the insulating film of the three-layered structure is called an ONO film.

Each of the selection transistors STS, STD has a gate layer 8 formed of the same conductor layer as the floating gate layer 5, for example. Unlike the floating gate 5, the gate layer 8 is short-circuited to a gate layer 9 which is formed of the same conductor layer as the control gate layer 7, for example. The gate layers 9 of the selection transistors STS, STD function as selection gate lines SGS, SGD. One example of a method for short-circuiting the gate layer 8 to the gate layer 9 is attained by forming an opening portion 11 in an insulating film 10 which is formed of the same insulator layer as the gate-gate insulating film 6, for example, and bringing the gate layer 9 into contact with the gate layer 8 via the opening portion 11. Thus, the gate layer 8 is integrally formed with the gate layer 9 and functions as the gate electrode of a corresponding one of the selection transistors STS, STD.

A method for ion-implanting impurity used to control the channel concentrations of the selection transistors STS, STD through the gate layers 8 via the opening portions 11 formed in the insulating films 10 is proposed by the inventor of this application and others (reference document 8).

Reference Document 8:

Japanese Patent Application No. 2001-158066, filed May 28, 2001.

U.S. patent application Ser. No. 10/155,086, filed May 28, 2002.

The entire contents of U.S. patent application Ser. No. 10/155,086 are incorporated herein by reference.

Figure 3A:
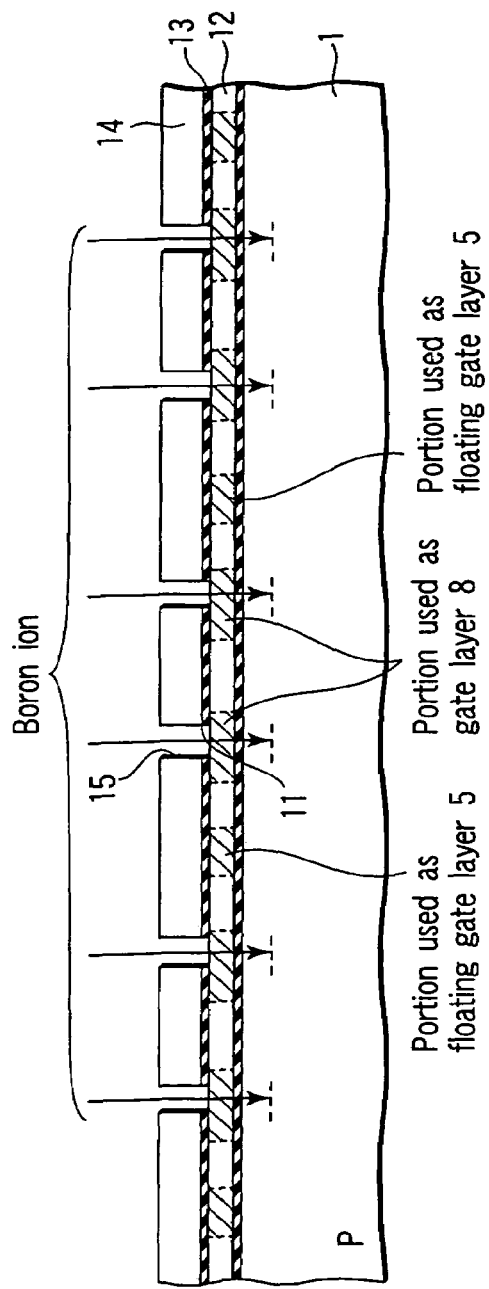
FIG. 3A is a cross sectional view showing one example of a channel impurity doping step and FIG. 3B is a cross sectional view showing one example of a non-volatile semiconductor memory device formed according to the example shown in FIG. 3A.

One example of the channel impurity doping step according to the above method is shown in FIG. 3A.

As shown in FIG. 3A, an insulator layer, for example, an ONO film 13 is formed on a conductor layer such as a conductive polysilicon layer 12 which is patterned into the pattern of the element active region AA, for example. The conductive polysilicon layer 12 is a conductor layer used to form the floating gate layers 5 and gate layers 8. Further, the ONO film 13 is an insulator layer used to form the gate-gate insulating films 6 and insulating films 10. Next, a mask layer, for example, photoresist layer 14 is formed on the ONO film 13 and windows 15 corresponding to the opening portions 11 are formed in the photoresist layer 14. Then, the insulating films 10 are etched with the photoresist layer 14 used as a mask to form the opening portions 11 in the insulating films 10. After this, for example, P-type impurity which is the same impurity as the P-type well 1, for example, boron is ion-implanted into the P-type well 1 via the conductive polysilicon layer 12 with the photoresist layer 14 used as a mask, for example. As a result, the impurity concentrations (channel concentrations) of portions of the P-type well 1 which lie below the gate layers 8 of the selection transistors STS, STD, that is, the channel regions of the selection transistors STS, STD are enhanced in comparison with those of the other regions.

Figure 3B:
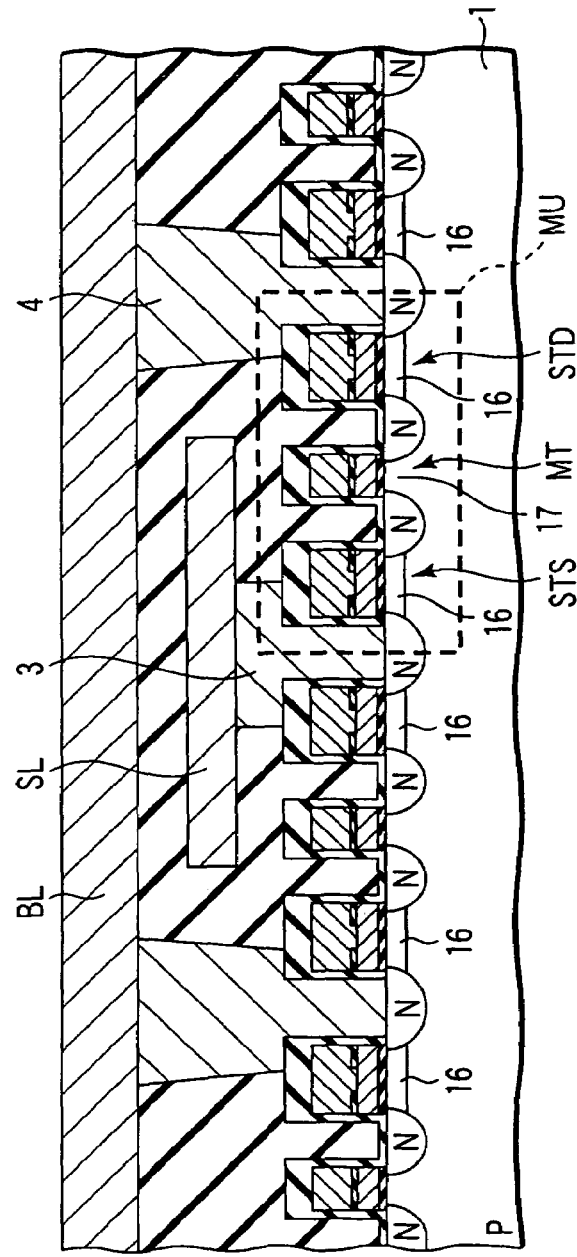

The cross section of a non-volatile semiconductor memory device formed according to one example of the above channel impurity doping process is shown in FIG. 3B.

As shown in FIG. 3B, the impurity concentration of each of the channel regions 16 of the selection transistors STS, STD is higher than the impurity concentration of the channel region 17 of the memory cell transistor MT. For example, as shown in FIG. 3B, by thus using one example of the above channel impurity doping process shown in FIG. 3A, the channel concentration of the memory cell transistor MT and the channel concentration of each of the selection transistors STS, STD can be separately controlled even when the fine-pattern memory cell transistors MT and fine-pattern selection transistors STS, STD are arranged with high density.

The N-type source/drain diffusion layer 2 of the source-side selection transistor STS and the common source line SL are connected together via the contact 3 and the N-type source/drain diffusion layer 2 of the drain-side selection transistor STD and the bit line BL are connected together via the contact 4. The contact 3 in the present example is formed to extend from the layer (first-layered metal interconnection layer) in which the common source line SL is formed and is directly formed onto the N-type source/drain diffusion layer 2 of the source-side selection transistor STS. Likewise, the contact 4 in the present example is formed to extend from the layer (second-layered metal interconnection layer) in which the bit line BL is formed and is directly formed onto the N-type source/drain diffusion layer 2 of the drain-side selection transistor STD.

The contacts 3, 4 in the present example are so-called self-aligned contacts. The self-aligned contact has a structure in which part of the contact covers portions above the gate electrodes (8, 9) of the selection transistors STS, STD. For example, mask member insulating films 18 are formed on the upper portions of the gate electrodes (8, 9) of the selection transistors STS, STD. The mask member insulating film 18 has etching selectivity with respect to an interlayer insulating film 19. One example of a material of the mask member insulating film 18 is a silicon nitride film (SiN). If the silicon nitride film is used as the material of the mask member insulating film 18, one example of a material of the interlayer insulating film 19 is a silicon oxide film ($SiO_2$). By thus causing the mask member insulating film 18 to have the etching selectivity with respect to the interlayer insulating film 19, only portions of the interlayer insulating film 19 which are embedded between the gate electrodes of the selection transistors STS and between the gate electrodes of the selection transistors STD can be selectively etched. As a result, contact holes can be formed in a self-alignment fashion in portions of the interlayer insulating film 19 which lie between the gate electrodes of the selection transistors STS and between the gate electrodes of the selection transistors STD. At this time, the conductor of the self-aligned contact 3 approaches the gate electrode of the selection transistor STS with a side wall insulating film 20 disposed therebetween and covers the gate electrode with the mask member insulating film 18 disposed therebetween. Likewise, the conductor of the self-aligned contact 4 approaches the gate electrode of the selection transistor STD with a side wall insulating film 20 disposed therebetween and covers the gate electrode with the mask member insulating film 18 disposed therebetween. However, the gate electrode which is formed in the vicinity of the conductor of the self-aligned contact 3 or 4 is not the gate electrode of the memory cell transistor MT but the gate electrode of the selection transistor STS or STD. Therefore, for example, high voltage induced on the bit line BL or the like will not act on the gate electrode of the memory cell transistor MT, for example, the floating gate layer 5.

Further, a case wherein the contacts 3, 4 are not formed as self-aligned contacts can be considered. In this case, for example, a portion between the memory cell transistor and the selection transistor is blocked by a structure in which a space between the selection transistor and the memory cell transistor is filled with a silicon oxide film. However, a structure in which only the N-type source/drain diffusion layer 2 between the selection transistors, the gate electrodes of peripheral transistors, the gate electrodes of the selection transistors and the control gate electrode of the memory cell transistor are formed of a silicide film can be considered (reference documents 9, 10).

Reference Document 9:

Japanese Patent Application No. 2001-075511, filed Mar. 16, 2001.

U.S. patent application Ser. No. 10/098,130, filed Mar. 15, 2002.

Reference Document 10:

Japanese Patent Application No. 2001-244557, filed Aug. 10, 2001.

U.S. patent application Ser. No. 10/214,582, filed Aug. 9, 2002.

The entire contents of both of U.S. patent application Ser. No. 10/098,130 and No. 10/214,582 are incorporated herein by reference.

According to the non-volatile semiconductor memory device of the first embodiment, the gate layer 8 and gate layer 9 are short-circuited by, for example, forming the opening portion 11 in the central portion of the insulating film 10 formed of the same insulator layer as the gate-gate insulating film 6, for example, in each of the gate electrodes of the selection transistors STS and STD. That is, a system of bringing the undersurface portion of the gate layer 9 into contact with the gate layer 8 is used (Japanese Patent Application No. 2000-291910, reference document 7). For example, the gate layer 9 is formed of the same conductor layer as the control gate layer 7. Therefore, the electrical resistance of the electrode material of the gate layers 9 of the selection transistors STS, STD, that is, the selection gate lines SGD, SGS becomes the same as the electrical resistance of the electrode material of the control gate layer 7 of the memory cell transistor MT, that is, the word line WL. The electrode material of the control gate layer 7 is a stacked structure of conductive polysilicon and metal silicide, for example. Metal silicide is tungsten silicide (WSi) or the like, for example. Further, the electrode material of the floating gate layer 5 is conductive polysilicon, for example.

Thus, since the electrical resistance of the electrode material of the selection gate lines SGD, SGS becomes the same as the electrical resistance of the electrode material of the word line WL, the electrical resistance of the electrode material of the selection gate lines SGD, SGS will not become higher than the electrical resistance of the electrode material of the word line WL, for example. Therefore, delay in the selection gate lines SGD, SGS can be reduced and a high speed operation can be attained.

Further, by using an interconnection material whose electrical resistance is low, for example, aluminum (Al) as the interconnection material of the common source line SL and bit line BL, delay in the common source line SL can be suppressed with respect to the selection gate lines SGD, SGS. At the same time, it is possible to form a compact common source line SL which can be disposed within the range of a three-transistor cell unit with a sufficiently large margin.

If the electrical resistance of the inter-connection material of the common source line SL cannot be made low with respect to that of the bit line BL, the common source line SL may be formed to extend, for example, from above the gate electrodes of the selection transistors STS, STD over to a portion above the gate electrode of the memory cell transistor MT as in the first embodiment, for example. When the above common source line SL is formed, it is only required to securely acquire the common source line area within the range of the portion above the memory cell transistor MT if a structure in which the contact 4 is formed directly from the bit line BL is formed as in the first embodiment, for example.

Thus, the wide common source line SL has an effect that the electrical resistance thereof can be reduced and noises from the memory cell transistor MT, for example, can be shielded with respect to the bit line BL.

The operation of the memory cell transistor MT of the non-volatile semiconductor memory device according to the first embodiment is basically the same as that of the memory cell transistor of a NAND flash memory.

For example, when data is written, high voltage Vpp is applied to the control gate of a selected memory cell transistor MT. As a result, an FN tunnel current flows to inject electrons into the floating gate layer 5 and data is thus written. In this case, if the coupling ratio is approximately 0.6, the high voltage Vpp is set at approximately 20 V.

For example, electrons are injected as data and it is assumed that data is "0" when the threshold voltage of the memory cell transistor MT is higher than certain reference voltage and data is "1" when electrons are not injected or are extracted and the threshold voltage of the memory cell transistor MT is lower than the reference voltage. This is the same as in the case of the conventional flash memory. Therefore, the operation of determining the presence or absence of data is the same as in the conventional case.

When data is erased, for example, the high voltage Vpp is applied to the P-type well 1 to extract electrons into the P-type well 1 and thus data is erased.

When data is read out, whether data is "0" or "1" can be determined according to whether the transistor MT is turned ON or OFF when certain voltage higher than the reference voltage is applied to the control gate layer 7 of the memory cell transistor MT in the memory block selected by use of the selection gate lines SGS, SGD since only one memory cell transistor MT is provided.

Further, since the structure in which only one memory cell transistor MT is formed in the memory cell unit MU is provided, the threshold voltage of the memory cell transistor MT may be set higher than certain voltage when data is written. That is, since no upper limit is imposed on the threshold voltage distribution, the threshold voltage distribution control operation can be made simple and the structure becomes strong against variations caused in the manufacturing process.

Second Embodiment

Figure 4:
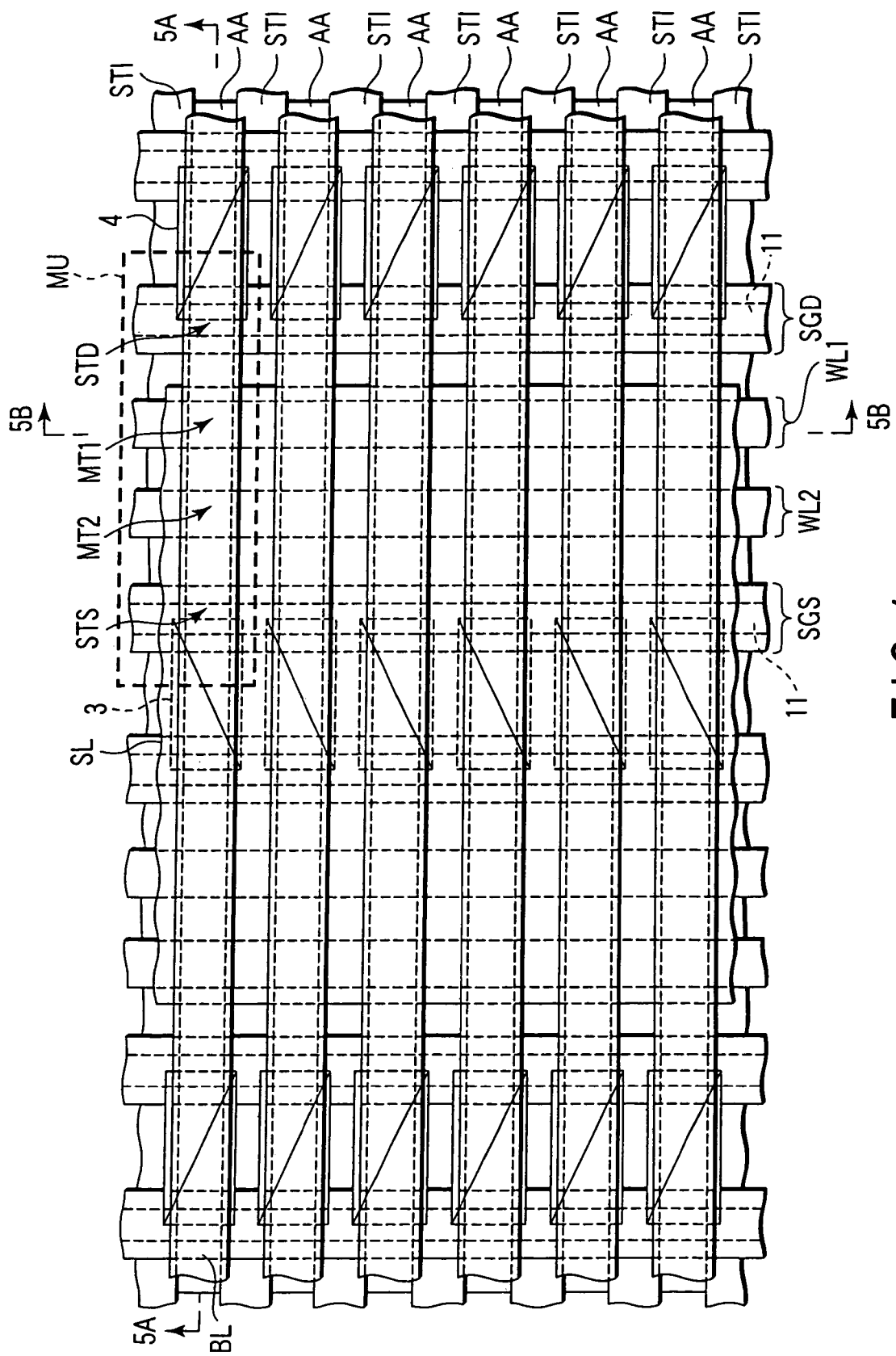
FIG. 4 is a plan view showing one example of a plane pattern of a non-volatile semiconductor memory device according to a second embodiment of the present invention.

FIG. 4 is a plan view showing one example of a plane pattern of a non-volatile semiconductor memory device according to a second embodiment of the present invention, FIG. 5A is a cross sectional view taken along the 5A-5A line of FIG. 4 and FIG. 5B is a cross sectional view taken along the 5B-5B line of FIG. 4.

As shown in FIGS. 4, 5A, 5B, the second embodiment uses a four-transistor cell unit instead of the three-transistor cell unit of the non-volatile semiconductor memory device according to the first embodiment. The four-transistor cell unit includes a source-side selection transistor STS, drain-side selection transistor STD and two memory cell transistors MT1, MT2 serially connected between the selection transistors STS and STD.

The two memory cell transistors MT1, MT2 are provided in a memory cell unit MU of the second embodiment. Therefore, for example, when data is read out from the memory cell transistor MT1, it is necessary to turn ON the memory cell transistor MT2 irrespective of the presence or absence of data therein. Likewise, when data is read out from the memory cell transistor MT2, it is necessary to turn ON the memory cell transistor MT1 irrespective of the presence or absence of data therein.

Thus, in the four-transistor cell unit, it is necessary to continuously apply voltage Vpass for turning ON the non-selected memory cell transistor irrespective of the presence or absence of data to the gate thereof at the data readout time. At this time, the threshold voltage of the memory cell transistor must be set lower than the voltage Vpass. Therefore, there occurs restriction due to so-called "Read disturb" which makes it necessary to set the lower limit and upper limit on the threshold voltage distribution. This is the same as in the conventional NAND flash memory.

However, the four-transistor cell unit can permit a larger cell current to flow and reduce time for sensing the cell current since the number of memory cell transistors is smaller than that of a NAND cell unit which includes 16 memory cell transistors, for example. That is, the four-transistor cell unit can perform a higher speed operation in comparison with the NAND cell unit. The four-transistor cell unit reduces an area for each bit of the memory, maintains the high speed operation and meets the requirement for the non-volatile semiconductor memory device which is eclectic between the cost merit due to the effect of a reduction in the chip area and the high speed accessibility due to the memory cells having a smaller number of transistors.

Further, since the three-transistor cell unit has one memory cell for each unit cell, it is advantageous for random access.

On the other hand, the four-transistor cell unit can perform random access, but since it has two memory cells for each unit cell, it basically performs serial access.

Like the second embodiment, the non-volatile semiconductor memory device according to the first embodiment can be modified to have four-transistor cell units.

Third Embodiment

Figure 6:
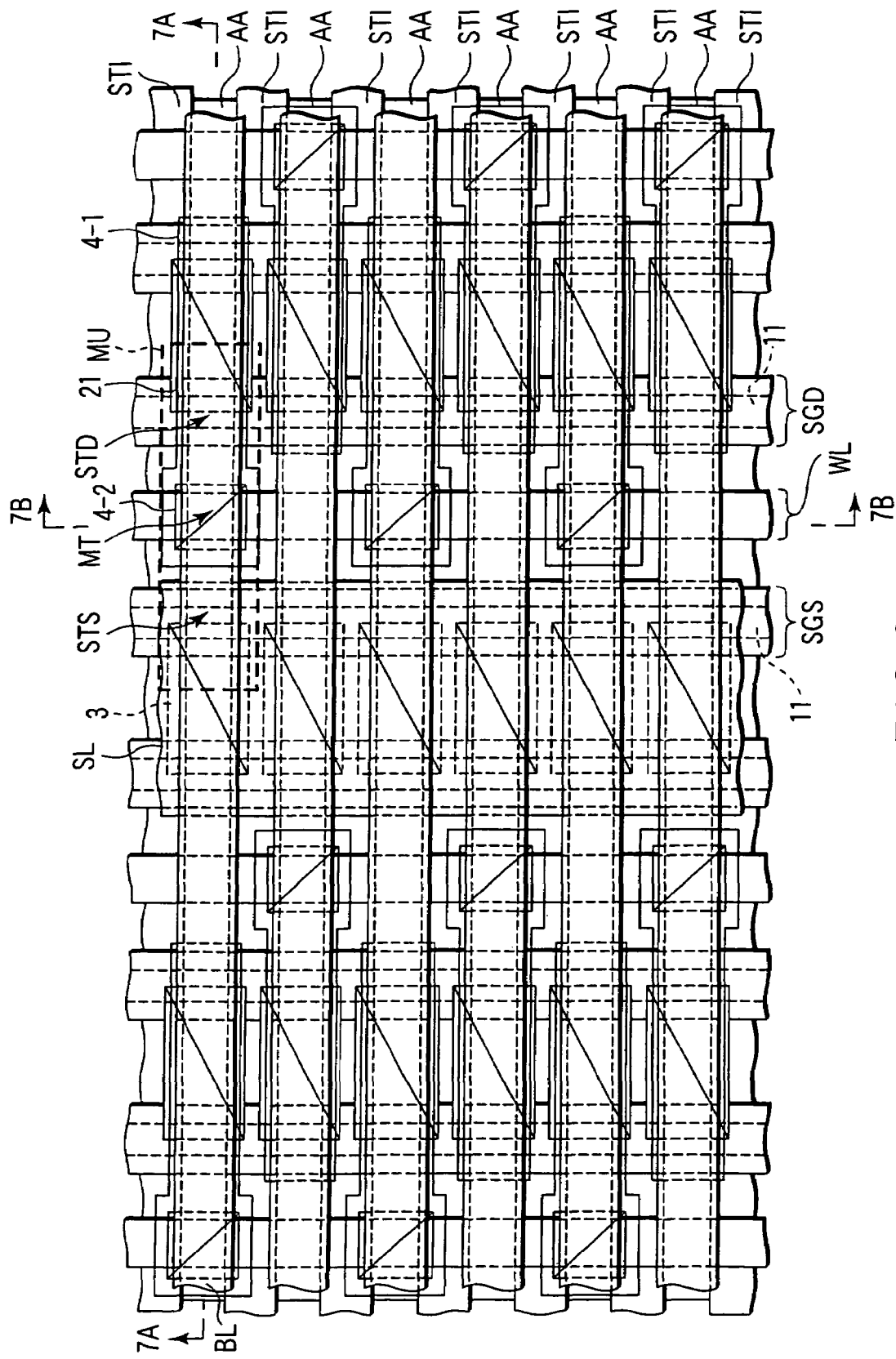
FIG. 6 is a plan view showing one example of a plane pattern of a non-volatile semiconductor memory device according to a third embodiment of the present invention.
Figure 7A:
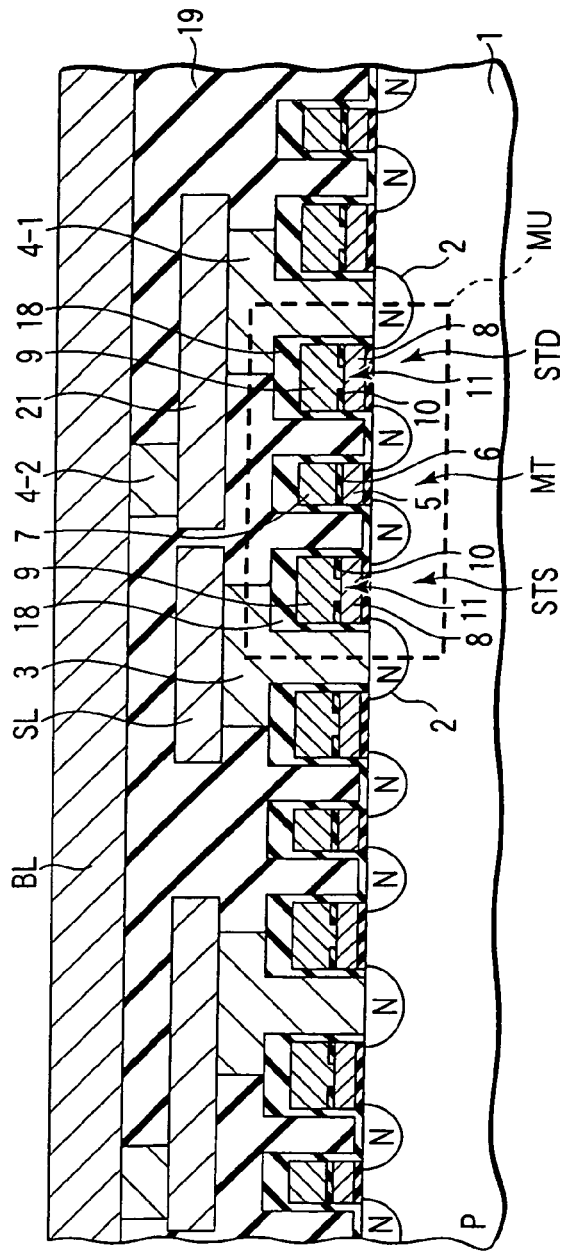
FIG. 7A is a cross sectional view taken along the 7A-7A line of FIG. 6
Figure 7B:
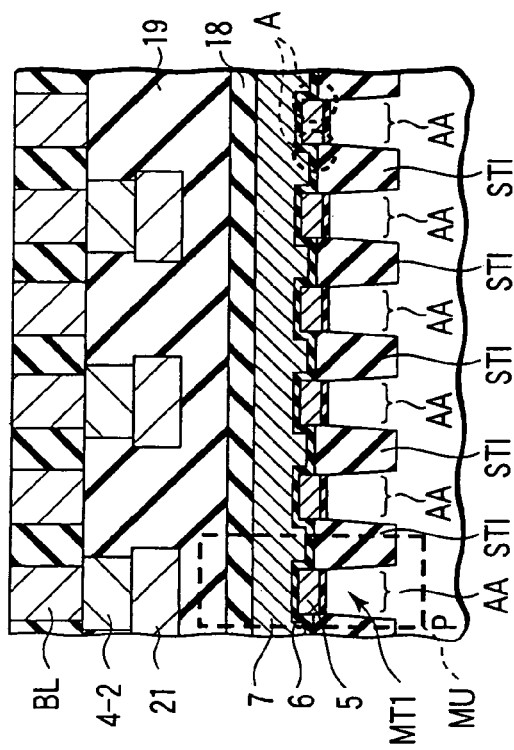
FIG. 7B is a cross sectional view taken along the 7B-7B line of FIG. 6.

FIG. 6 is a plan view showing one example of a plane pattern of a non-volatile semiconductor memory device according to a third embodiment of the present invention, FIG. 7A is a cross sectional view taken along the 7A-7A line of FIG. 6 and FIG. 7B is a cross sectional view taken along the 7B-7B line of FIG. 6.

In the third embodiment, the contact 4 of the non-volatile semiconductor memory device according to the first embodiment is modified and formed to have a plurality of layers.

As shown in FIGS. 6, 7A, 7B, an N-type source/drain diffusion layer 2 of a drain-side selection transistor STD is connected to a contact interconnection 21 via a first-layered contact 4-1. For example, the contact interconnection 21 is formed of a first-layered metal interconnection layer which is the same as a common source line SL. The contact interconnection 21 is connected to a bit line BL via a second-layered contact 4-2. The non-volatile semiconductor memory device of the third embodiment is substantially similar to the non-volatile semiconductor memory device of the first embodiment except that the contact 4 is formed of a plurality of individual layers which include the contact 4-1, contact interconnection 21 and contact 4-2, for example.

Like the case of the third embodiment, the contact 4 of the non-volatile semiconductor memory device of the first embodiment is not directly formed on the N-type diffusion layer but can be formed of a plurality of individual layers which include the first-layered contact 4-1, contact interconnection 21 and second-layered contact 4-2, for example.

When the contact 4 is formed of a plurality of separate layers, it is necessary to consider a certain amount of margin by taking a variation in the manufacturing process of the contact interconnection 21 and the like into consideration, for example. Therefore, there occurs a possibility that an area in which the common source line SL is arranged cannot be securely attained.

In the above case, for example, like the non-volatile semiconductor memory device of the first embodiment, it is advantageous to use the structure in which the contact 4 is formed to extend from the layer (second-layered metal interconnection layer) in which the bit line BL is formed and is directly formed onto the N-type source/drain diffusion layer 2 of the drain-side selection transistor STD.

Fourth Embodiment

Figure 9A:
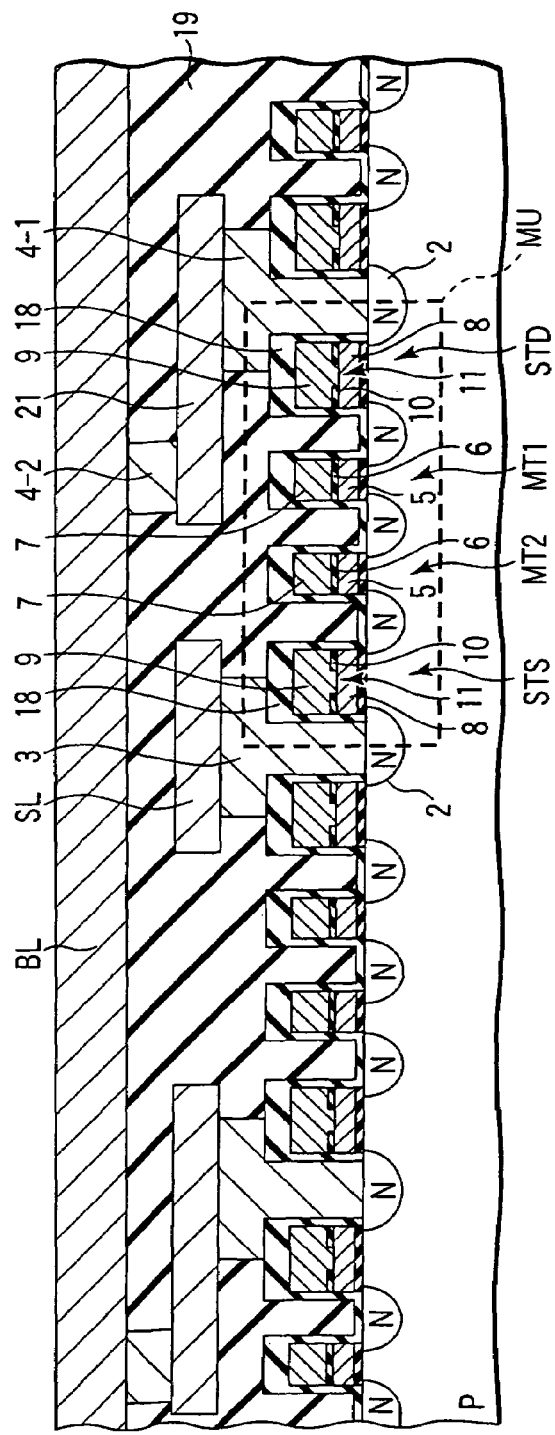
FIG. 9A is a cross sectional view taken along the 9A-9A line of FIG. 8
Figure 9B:
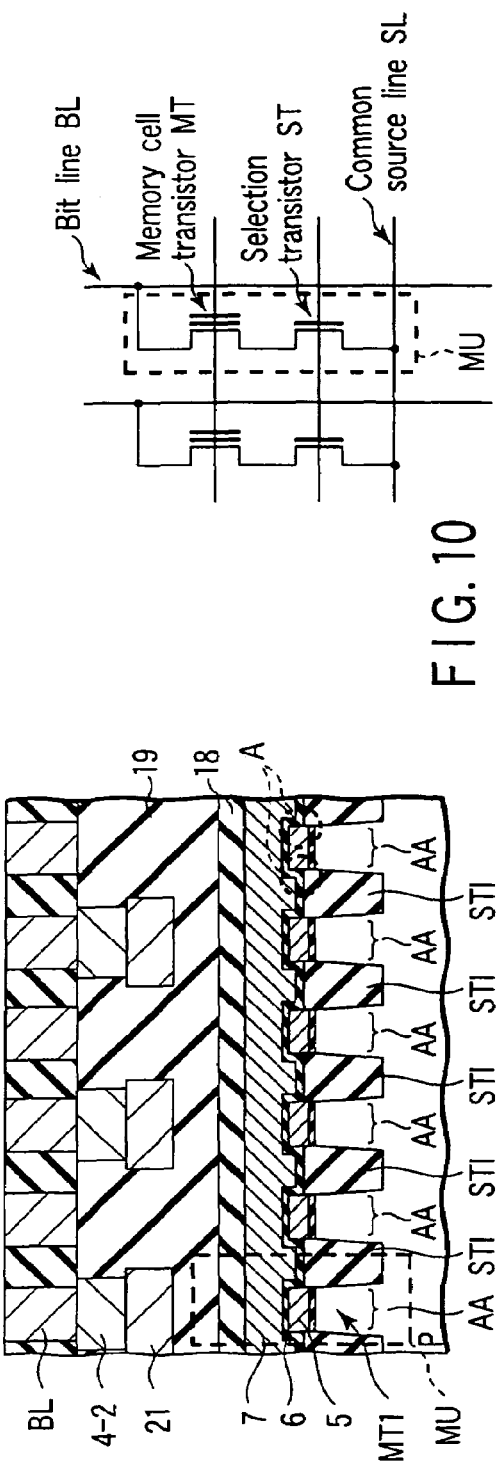
FIG. 9B is a cross sectional view taken along the 9B-9B line of FIG. 8.

FIG. 8 is a plan view showing one example of a plane pattern of a non-volatile semiconductor memory device according to a fourth embodiment of the present invention, FIG. 9A is a cross sectional view taken along the 9A-9A line of FIG. 8 and FIG. 9B is a cross sectional view taken along the 9B-9B line of FIG. 8.

As shown in FIGS. 8, 9A, 9B, in the fourth embodiment, the contact 4 of the non-volatile semiconductor memory device according to the second embodiment is formed to have a plurality of individual layers. The non-volatile semiconductor memory device of the fourth embodiment is similar to the non-volatile semiconductor memory device of the second embodiment except that the contact 4 is formed of a plurality of separate layers which include a contact 4-1, contact interconnection 21 and contact 4-2, for example.

Like the case of the fourth embodiment, the contact 4 of the non-volatile semiconductor memory device of the second embodiment is not directly formed on the N-type diffusion layer but can be formed of a plurality of individual layers which include the first-layered contact 4-1, contact interconnection 21 and second-layered contact 4-2, for example.

Fifth Embodiment

Figure 10:
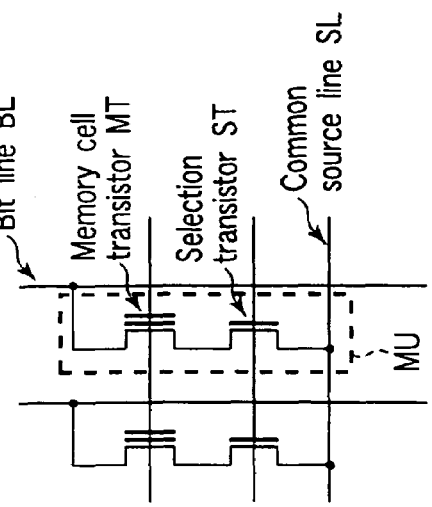
FIG. 10 is a circuit diagram showing one circuit example of a memory cell unit provided in a non-volatile semiconductor memory device according to a fifth embodiment of the present invention.

FIG. 10 is a circuit diagram showing one circuit example of a memory cell unit provided in a non-volatile semiconductor memory device according to a fifth embodiment of the present invention.

As a memory cell unit MU, a memory cell unit MU as shown in FIG. 10 can be considered in addition to the three-transistor cell unit as explained in the first and third embodiments and the four-transistor cell unit as explained in the second and fourth embodiments.

The memory cell unit shown in FIG. 10 includes one selection transistor ST and one memory cell transistor MT connected to make one pair between a source line SL and a bit line BL. In this specification, the memory cell unit MU is called a two-transistor cell unit.

In the two-transistor cell unit shown in FIG. 10, particularly, the selection transistor ST is connected to the common source line SL and the memory cell transistor MT is connected to the bit line BL. In this case, however, it is possible to connect the selection transistor ST to the bit line BL and connect the memory cell transistor MT to the common source line SL in the two-transistor cell unit.

Figure 11:
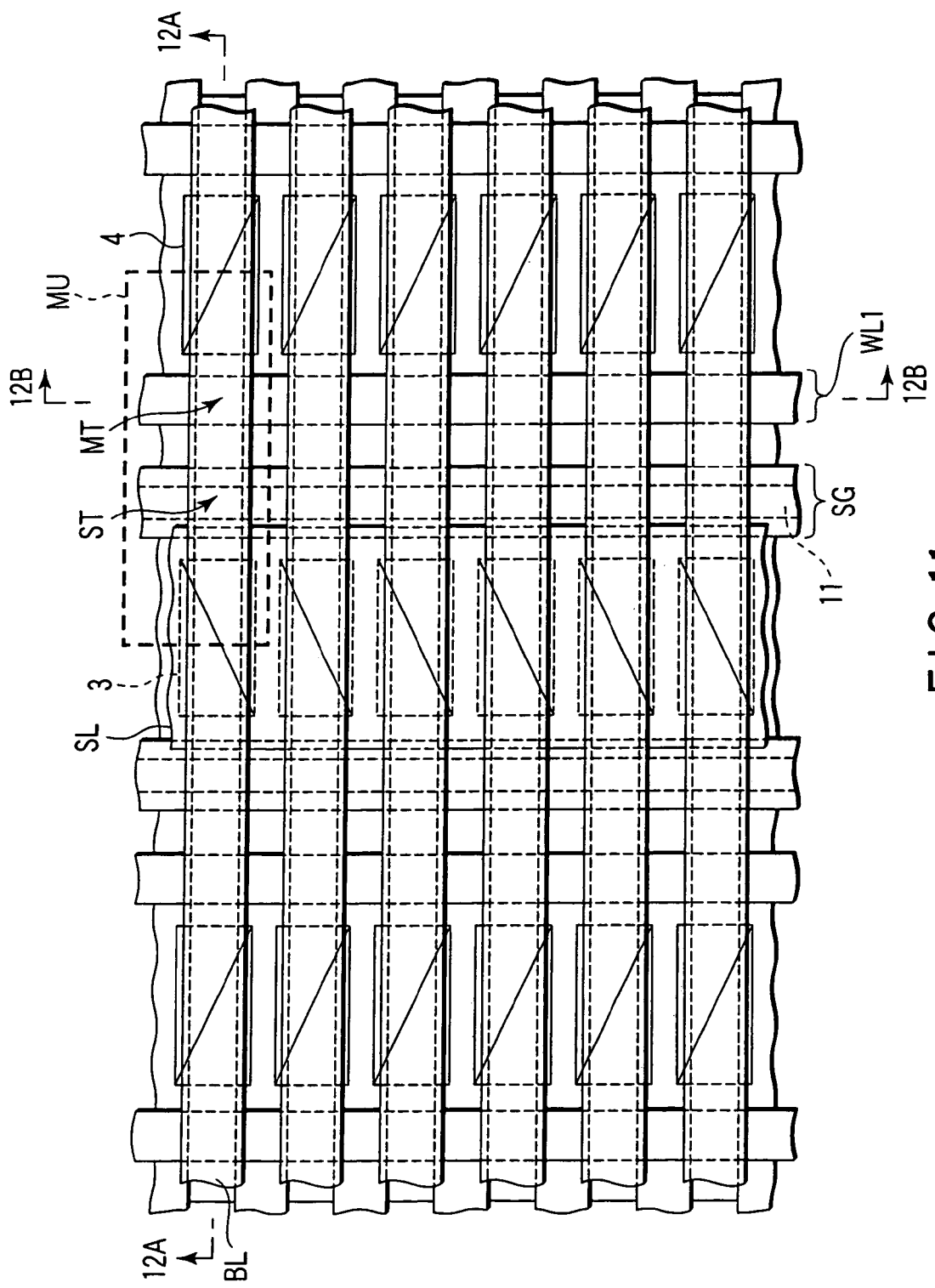
FIG. 11 is a plan view showing one example of a plane pattern of the non-volatile semiconductor memory device according to the fifth embodiment of the present invention.
Figure 12A:
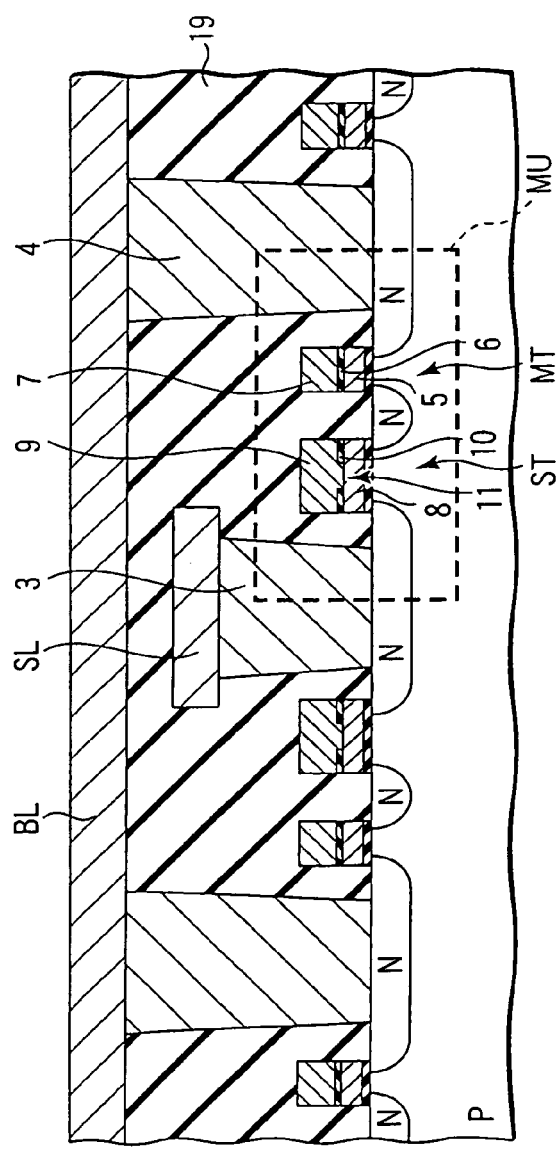
FIG. 12A is a cross sectional view taken along the 12A-12A line of FIG. 11
Figure 12B:
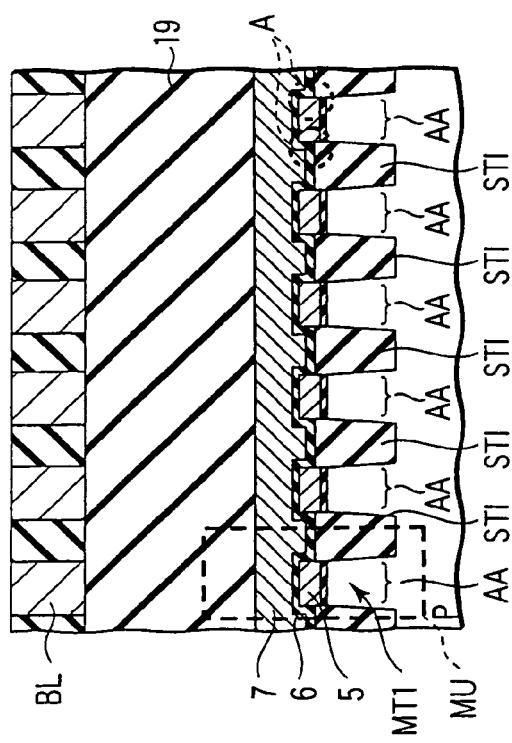
FIG. 12B is a cross sectional view taken along the 12B-12B line of FIG. 11.

FIG. 11 is a plan view showing one example of a plane pattern of the non-volatile semiconductor memory device according to the fifth embodiment of the present invention, FIG. 12A is a cross sectional view taken along the 12A-12A line of FIG. 11 and FIG. 12B is a cross sectional view taken along the 12B-12B line of FIG. 11.

As shown in FIGS. 11, 12A, 12B, the two-transistor cell unit includes one selection transistor ST and one memory cell transistor MT connected to the selection transistor ST.

An N-type source/drain diffusion layer 2 of the selection transistor ST is connected to the common source line SL via a contact 3. Further, an N-type source/drain diffusion layer 2 of the memory cell transistor MT is connected to the bit line BL via a contact 4. Thus, the memory cell unit MU is connected between the source line SL and a data line or the bit line BL.

The contacts 3, 4 of this example are not self-aligned contacts unlike the contacts 4 explained in the first to fourth embodiments. One of the reasons is that high voltage induced in the bit line BL or the like may act on the gate electrode, for example, the floating gate layer 5 of the memory cell transistor MT if a self-aligned contact is formed with respect to the gate electrode of the memory cell transistor MT, for example.

However, it may be possible to use a self-aligned contact as the contact 3. In this case, the contact 3 is formed as a self-aligned contact with respect to the gate electrode of the selection transistor ST. If a self-aligned contact is used as the contact 3, a mask member insulating film 18 (not shown) may be formed at least on the gate electrode of the selection transistor ST in the non-volatile semiconductor memory device shown in FIGS. 11, 12A, and 12B.

Like the case of the fifth embodiment, the non-volatile semiconductor memory device of the first embodiment can be modified to include two-transistor cell units.

Further, the non-volatile semiconductor memory devices of the second to fourth embodiments can also be modified to include two-transistor cell units.

Sixth Embodiment

Figure 13:
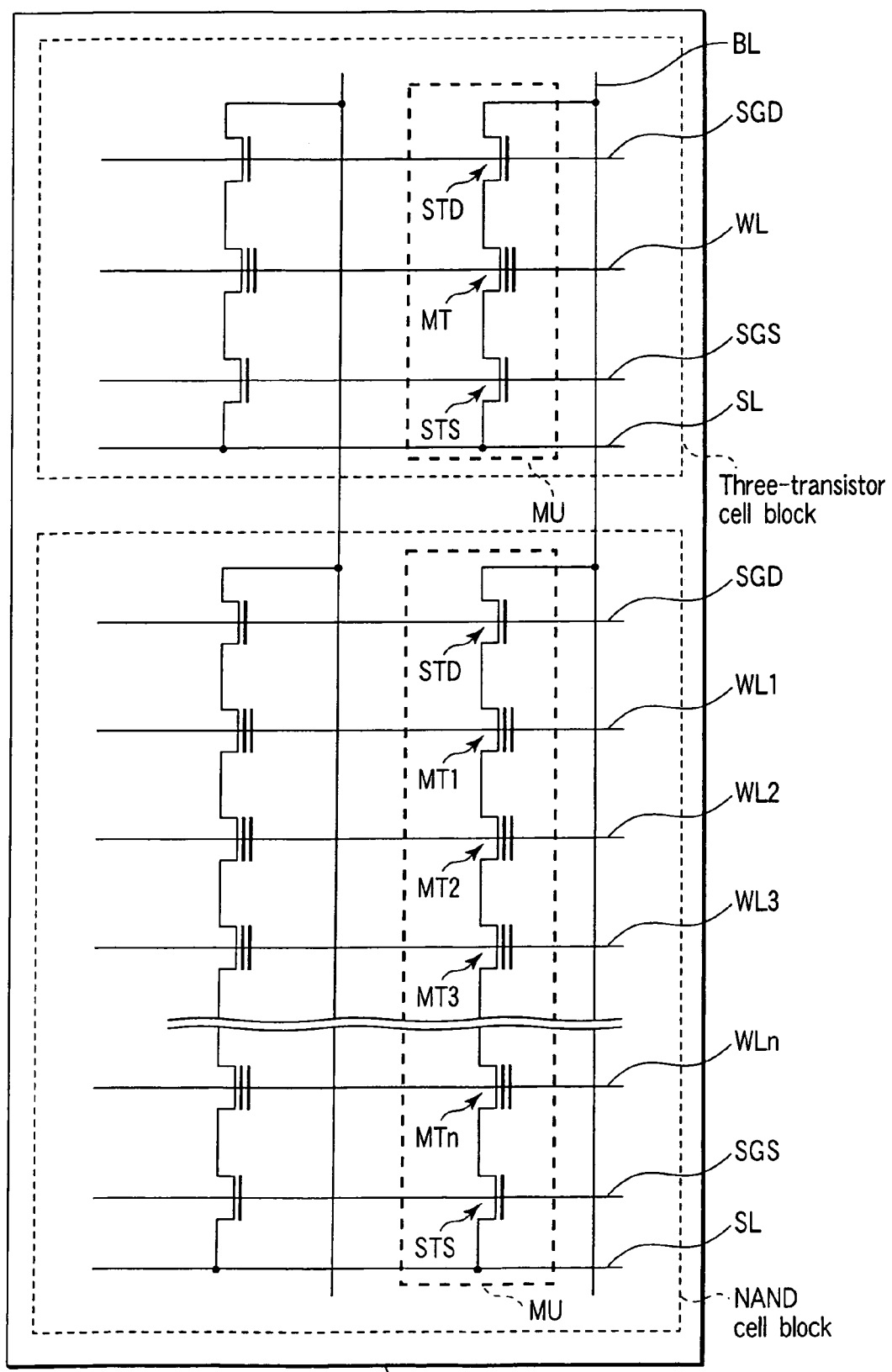
FIG. 13 is a circuit diagram showing one circuit example of a memory cell array provided in a non-volatile semiconductor memory device according to a sixth embodiment of the present invention.

FIG. 13 is a circuit diagram showing one circuit example of a memory cell array provided in a non-volatile semiconductor memory device according to a sixth embodiment of the present invention.

As an application example of the non-volatile semiconductor memory device having a structure based on the first to fifth embodiments, the three-transistor cell block explained in the first and third embodiments is arranged together with the NAND cell block in the same memory cell array. Then, a portion which stores information requiring high-speed memory access, for example, is provided in the three-transistor cell block and a portion which holds data, for example, is provided in the NAND cell block. The architecture similar to that of the memory system of the non-volatile semiconductor memory device according to the sixth embodiment is described in Jpn. Pat. Appln. KOKAI Publication No. 10-134588 (reference document 11). In the reference document 6, the architecture for arranging a NOR cell block and NAND cell block in the same memory cell array, for example, is disclosed.

Reference Document 11:
Jpn. Pat. Appln. KOKAI Publication No. 10-134588

As shown in FIG. 13, in the architecture for arranging a NAND cell block and three-transistor cell block in the same memory cell array, when the memory cell array is gradually miniaturized, slits can be formed in the NAND cell block, but it becomes difficult to form slits in the three-transistor cell block as explained in the item of "BACKGROUND OF THE INVENTION". As a result, it becomes difficult to form the NAND cell block together with the three-transistor cell block in the same memory cell array.

Therefore, for example, the non-volatile semiconductor memory device according to the first or third embodiment is used in the three-transistor cell block. Thus, it becomes possible to freely adjust the length of the memory cell block sandwiched between the selection transistors STS and STD, for example. As a result, even when miniaturization of the non-volatile semiconductor memory device proceeds, the NAND cell block and the three-transistor cell block can be arranged in the same memory cell array 50 as indicated by the memory cell array 50 shown in FIG. 13.

Further, the three-transistor cell block of the sixth embodiment can be replaced by the four-transistor cell block in the non-volatile semiconductor memory device according to the second or fourth embodiment or the two-transistor cell block in the non-volatile semiconductor memory device according to the fifth embodiment, for example.

Figure 14:
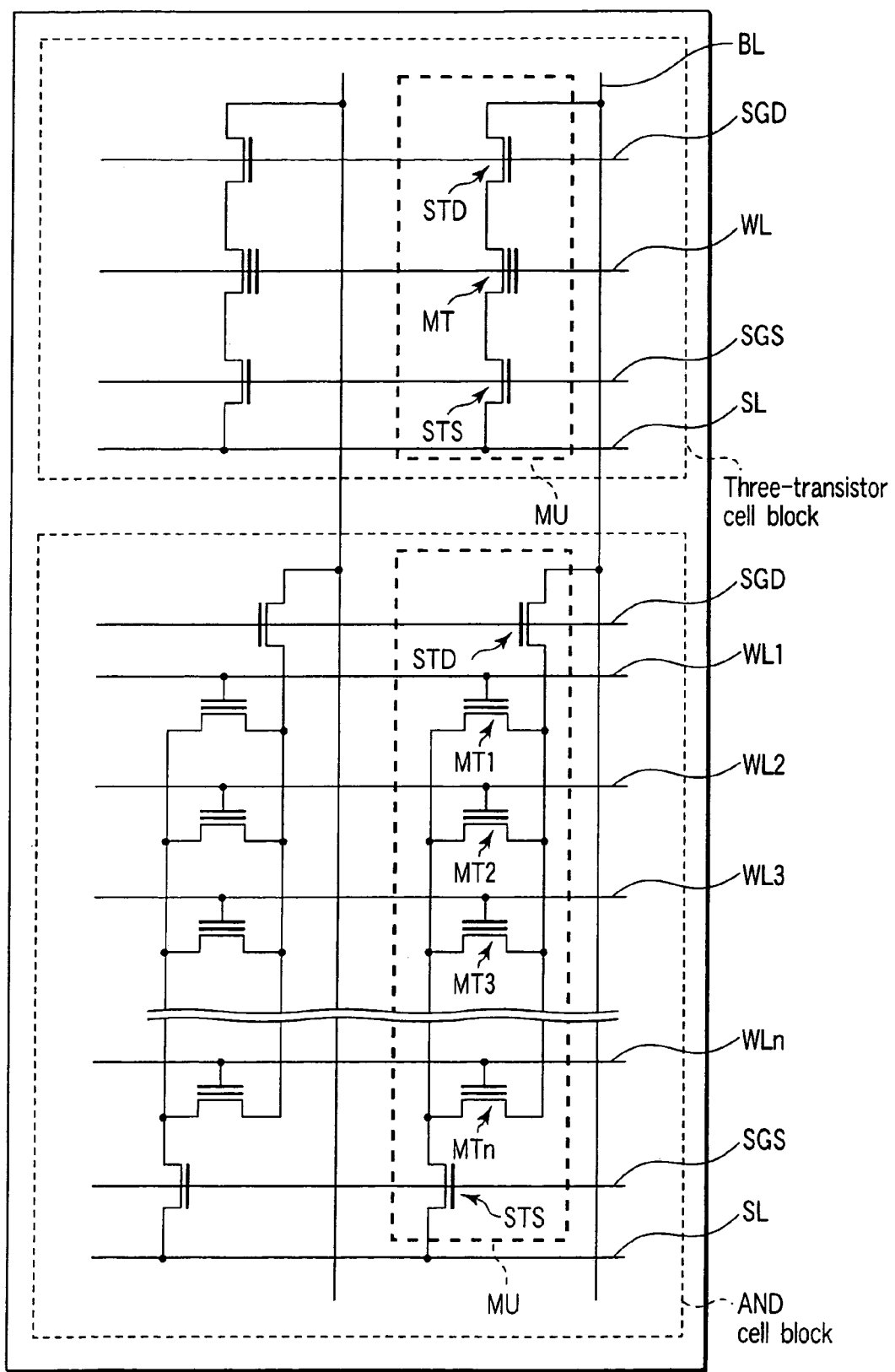
FIG. 14 is a circuit diagram showing one circuit example of a memory cell array provided in a non-volatile semiconductor memory device according to a modification of the sixth embodiment of the present invention.

In addition, as shown in FIG. 14, an AND cell block can be used instead of the NAND cell block of the sixth embodiment.

When the NAND cell block is replaced by the AND cell block as shown in FIG. 14, the four-transistor cell can be formed in an AND configuration.

Seventh Embodiment

As described above, the NAND flash EEPROM has an advantage that it is advantageous over the NOR flash EEPROM in attaining large memory capacity.

In the NAND EEPROM, a plurality of non-volatile memory cells are serially connected and a selection transistor is coupled to the end portion thereof to configure a so-called memory cell string (NAND string). In the NAND string, an area occupied by bit line contacts and common source lines becomes relatively smaller as the number of memory cells becomes larger and the scalability (reduction rate) of the memory cell array can be improved. Therefore, in order to attain the high density and large memory capacity, it is preferable to increase the length of the NAND string (that is, the number of memory cells).

However, if the NAND string becomes longer, a cell current at the data readout time becomes smaller. This is because non-selected cells serially connected with a selected cell of the NAND string are turned ON when data is read out from the selected cell and a reduction in the total conductance of the non-selected cells becomes large. If the cell current becomes small, the high speed operation cannot be performed and the readout cell current is further reduced by repeatedly performing the write and erase operations, and consequently, there occurs a possibility that the reliability of the device may not be securely attained.

Since the cell current varies in proportion to the width of the active region of the memory cell, a certain amount of cell current can be attained by increasing the width of the active region, but in this case, it becomes difficult to attain large memory capacity.

As described above, in the NAND EEPROM, it is difficult to simultaneously attain the large memory capacity and the high speed performance and high reliability. The seventh embodiment of the present invention relates to a semiconductor memory device which is designed to simultaneously attain the large memory capacity and the high speed performance and high reliability.

FIG. 15A is an equivalent circuit diagram showing one equivalent circuit example of a memory cell array of a NAND EEPROM according to the seventh embodiment of the present invention and FIG. 15B is a plan view showing one layout example thereof.

In the example shown in FIGS. 15A, 15B, for example, the memory cell array is divided into three cell blocks A, B, C and each of the cell blocks is defined as a range to be subjected to a simultaneous data erasing process. The first cell block A includes memory cell strings (that is, NAND strings or NAND cell units) 30$a$ each having a series-connected circuit of n non-volatile memory cells MC0 to MCn−1 and selection transistors S1, S2 connected to both ends of the series-connected circuit. The drain of the selection transistor S1 is connected to a corresponding one of data transfer lines (which are hereinafter referred to as bit lines) BL which are respectively provided for the NAND strings 30$a$. The source of the other selection transistor S2 is connected to a reference potential line (which is hereinafter referred to as a common source line) SL commonly provided for the NAND strings 30$a$.

The second cell block B includes NAND strings 30$b$ each having a series-connected circuit of m (m<n) non-volatile memory cells MC0 to MCm−1 and selection transistors S1, S2 connected to both ends of the series-connected circuit. The drain of the selection transistor S1 is connected to a corresponding one of the bit lines BL which are respectively provided for the NAND strings 30$b$ and the source of the other selection transistor S2 is connected to a common source line SL commonly provided for the NAND strings 30$b$.

The third cell block C includes NAND strings 30$c$ each configured by connecting both ends of one memory cell MC0 to selection transistors S1, S2. The drain of the selection transistor S1 is connected to a corresponding one of the bit lines BL and the source of the selection transistor S2 is connected to a common source line SL.

The control gates of the memory cells arranged on the same row in the respective NAND strings 30a, 30b, 30c of the cell blocks A, B, C are commonly connected to a corresponding one of word lines WL and the gates of the selection transistors S1, S2 arranged on the same row are commonly connected to a corresponding one of selection gate lines SSL, GSL. In the present embodiment, the bit lines BL are each continuously formed to extend over the cell blocks A to C.

In this case, assume that each of the cell blocks A, B, C can store binary data. Alternatively, as another example, the cell block A having the largest NAND string can store multi-value data such as four-value data in order to store large-capacity data and the cell blocks B, C each having the NAND string smaller than that of the cell block A can store binary data. As still another example, only the cell block C having the smallest NAND string can be designed to store binary data and the other cell blocks A, B can be designed to store four-value data.

FIG. 15B shows a pattern of active regions (element regions) defined in a stripe form and word lines WL and selection gate lines SSL, GSL which are configured by continuously forming the gates of the memory cells and selection transistors. In FIG. 15B, the bit lines and common source lines are omitted and only the contacts thereof are shown.

As shown in FIG. 15B, the width of each of the active regions of the cell blocks A to C is set at d0 which is constant. Further, the word line pitch in the blocks A, B having a plurality of word lines WL is equally set to w0.

In the example of FIGS. 15A, 15B, one NAND string is arranged in the bit line direction in each of the cell blocks A, B, C, but in practice, a plurality of NAND strings can be arranged in the bit line direction in each of the cell blocks A, B, C. In this case, two NAND strings which are adjacent in the bit line direction in one cell block may be formed to commonly have bit line contacts and common source line contacts, for example.

Figure 16:
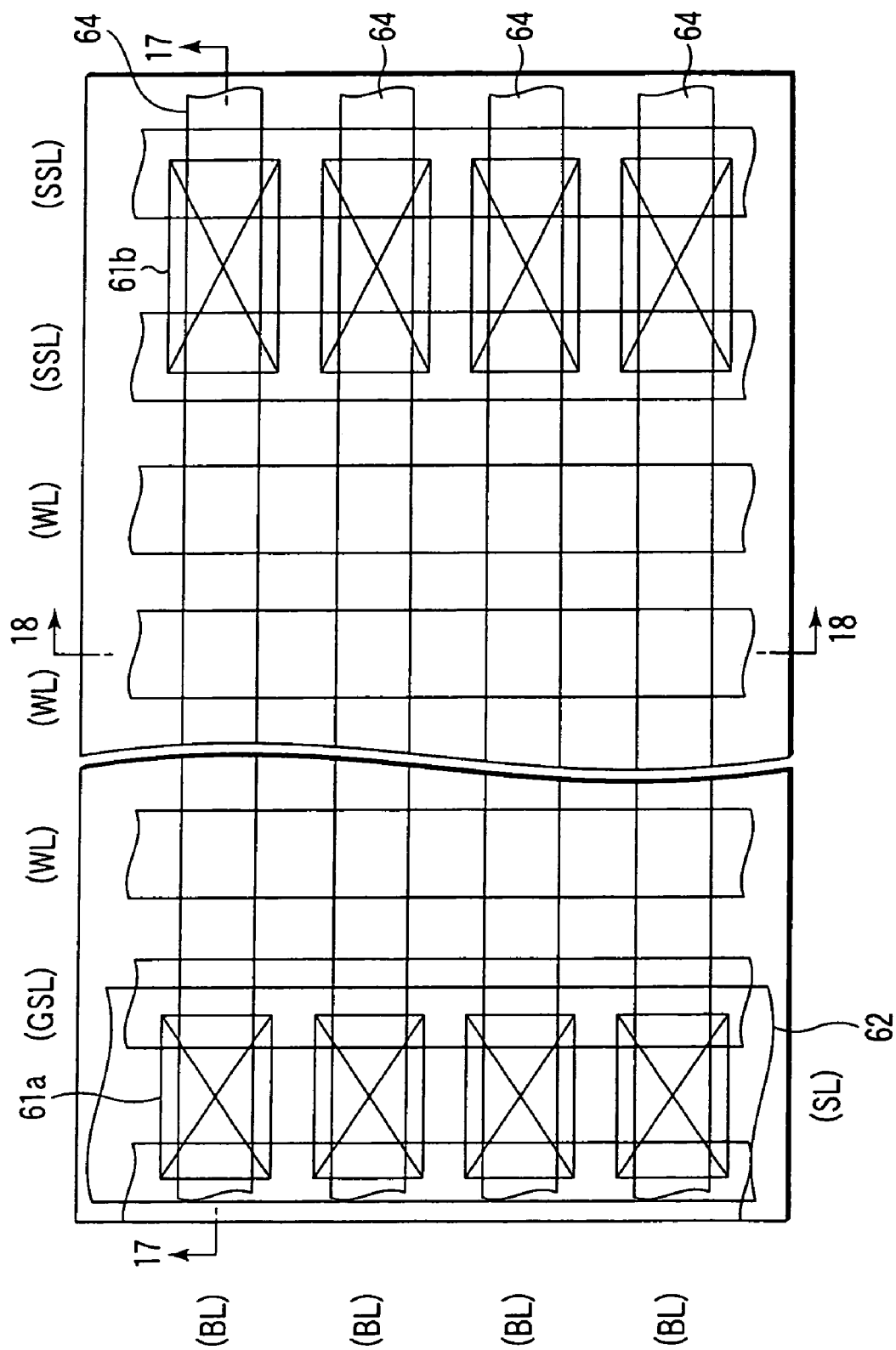
FIG. 16 is a plan view showing one concrete example of the layout example shown in FIG. 15B.
Figure 17:
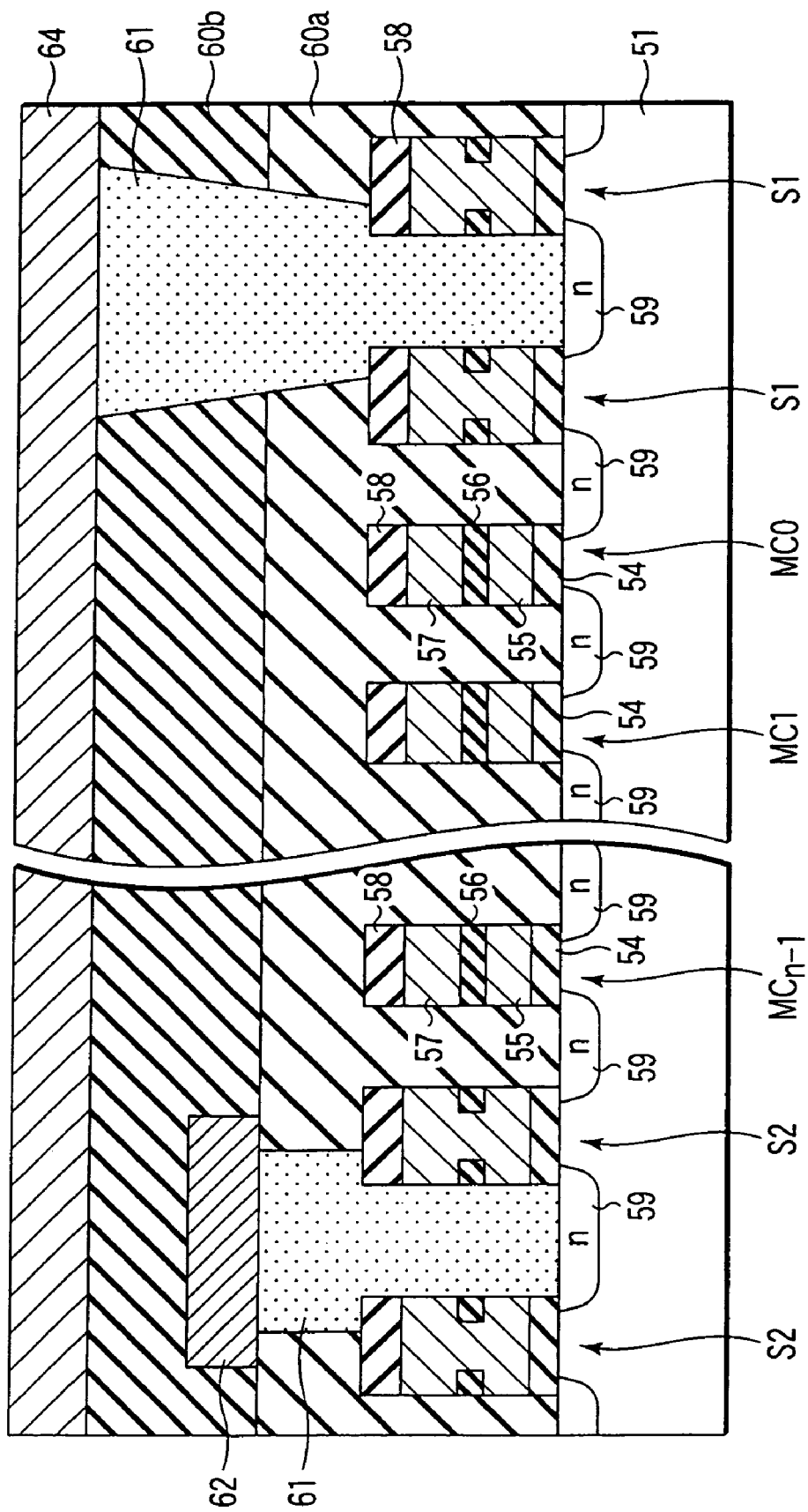
FIG. 17 is a cross sectional view taken along the 17-17 line of FIG. 16.
Figure 18:
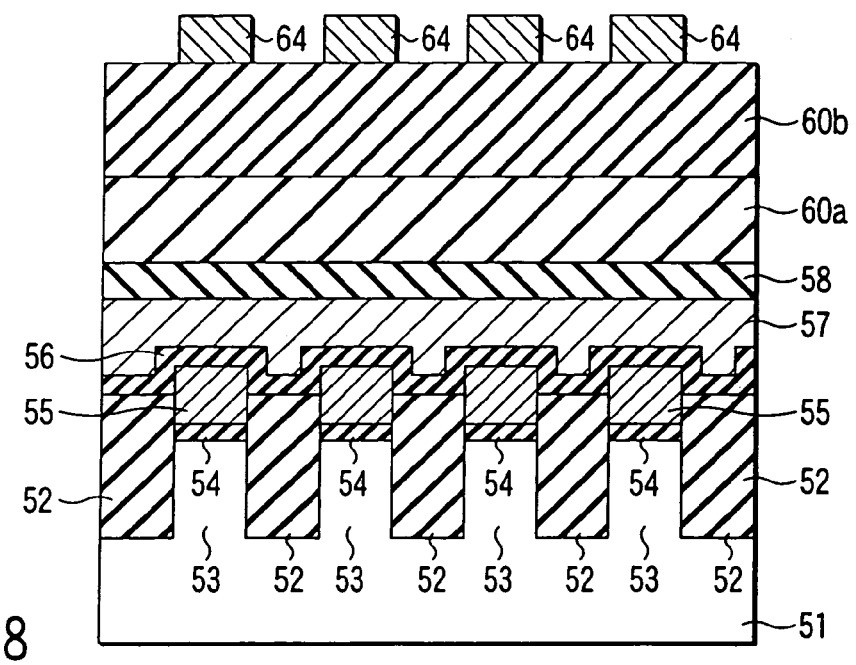
FIG. 18 is a cross sectional view taken along the 18-18 line of FIG. 16.

A more concrete example of the cell block layout is shown in FIG. 16, the cross section taken along the 17-17 line of FIG. 16 is shown in FIG. 17 and the cross section taken along the 18-18 line of FIG. 16 is shown in FIG. 18. In this case, the cell block A shown in FIG. 15A is taken as an example, but the configuration of another cell block can be shown in the same manner except that only the number of cells is different.

As shown in FIGS. 16 to 18, in a cell array region of a silicon substrate 51, a p-type well is formed for each cell block. On the p-type well, stripe-form element regions (active regions) 53 are defined by element isolation insulating films 52. One example of the element isolation insulating film 52 is an STI (Shallow Trench Isolation) region.

A floating gate 55 is formed above each of the element regions 53 with a tunnel insulating film 54 disposed therebetween and a control gate 57 is formed above the floating gate 55 with a gate-gate insulating film 56 disposed therebetween. Further, source and drain diffusion layers 59 which are self-aligned with the control gate are formed to complete a memory cell. The control gate 57 is patterned to continuously extend in one direction to form a word line WL.

In the present embodiment, as shown in FIG. 18, the floating gate 55 of each memory cell is formed in the self-alignment fashion between the element isolation insulating films 52. After embedding the floating gates 55, the upper portions of the element isolation insulating films 52 are etched so that the floating gates 55 will project from the upper surface of the element isolation insulating films 52. Therefore, the control gate 57 is formed to face not only the upper surfaces of the floating gates 55 but also both of the side surfaces thereof to attain large coupling capacitances.

As shown in FIG. 17, the gate electrode of each of the selection transistors S1, S2 is formed by short-circuiting the upper and lower polysilicon films which will be used as the floating gate 55 and control gate 57 in the memory cell. The gates of the memory cell MC and selection transistors S1, S2 are patterned with the gates thereof covered with silicon nitride films 58.

A first interlayer insulating film 60a is formed on the substrate on which the memory cells and selection transistors are formed and a common source line (SL) 62 which is a first-layered metal interconnection is formed on the first interlayer insulating film 60a. The common source line 62 is connected to a source-side diffusion layer 59 of the NAND string via a contact plug 61a filled in a contact hole formed in the interlayer insulating film 60a. A second interlayer insulating film 60b is further formed on the first interlayer insulating film 60a and a bit line (BL) 64 which is a second-layered metal interconnection is formed on the second interlayer insulating film. The bit line 64 is connected to a drain-side diffusion layer 69 of the NAND string via a contact plug 61b filled in contact holes continuously formed in the interlayer insulating films 60a, 60b.

The contact plugs 61a, 61b are each embedded in a region between corresponding two selection transistors S1, S2 of the adjacent cell blocks in a self-alignment fashion. That is, a contact hole which is self-aligned with a gate-gate space is formed by etching the interlayer insulating film by use of a mask having an opening larger than the gate-gate space while the silicon nitride films 58 which cover the gate electrodes are used as an etching stopper. Thus, the contact plugs 61a, 61b are each embedded to partly cover the gate electrodes of the adjacent selection transistors.

As described before, FIGS. 15A and 15B show a case wherein the size of one cell block in the bit line direction corresponds to one NAND string. On the other hand, FIGS. 16 to 18 show a case wherein the cell block is so configured that the NAND strings which are adjacent in the bit line direction commonly use the drain diffusion layer and source diffusion layer and a plurality of NAND strings are arranged in the bit line direction.

Figure 19:
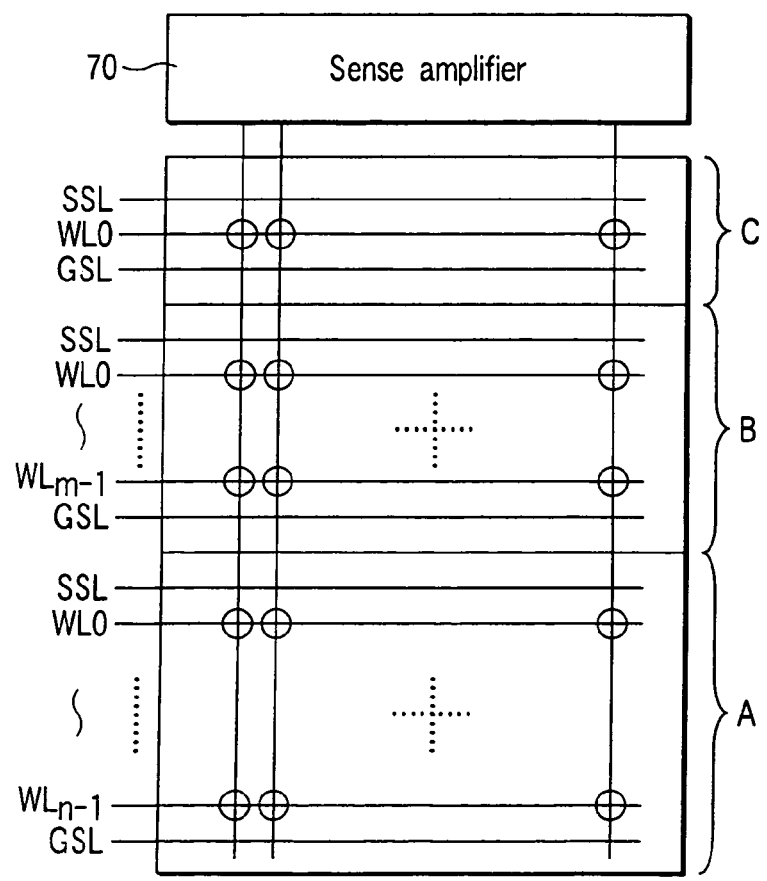
FIG. 19 is a plan view showing a layout example of a memory cell array and sense amplifier of the non-volatile semiconductor memory device according to the seventh embodiment of the present invention.

In the present embodiment, as shown in FIGS. 15A and 15B, the bit line BL is continuously formed to extend over the cell blocks A to C. Therefore, as shown in FIG. 19, a sense amplifier 70 commonly used by the cell blocks A to C is arranged on one end side of the cell blocks A to C.

According to the present embodiment, since the cell blocks having NAND strings of different sizes are formed on one chip, the performance for each application can be attained by adequately separating the regions inside the chip according to the application. For example, since the cell block C having the smallest number of memory cells of the NAND string is excellent in the high speed performance, it can be used as a program code storing region in which the number of writing operations is large and high speed access is required. For example, the cell blocks A, B are each used as an image data storing region in which the high speed performance is not so much required, but large memory capacity is required because of the high density. In this case, since the cell blocks A, B have different string lengths, the cell block A is used as a data region having larger memory capacity and the cell block B is used as a data region in which a higher speed performance than that of the cell block A is required.

Thus, the trade-off relation between the high speed performance, high reliability and the high density, large memory capacity can be improved in comparison with a case wherein the lengths of the NAND strings are made constant. Further, if the cell block C stores binary data in order to perform the high speed write/readout operation and the cell block A having the long NAND string is used as a large capacity data storage region to store four-value data, the application of the respective cell blocks can be more adequately optimized. The cell block B may store four-value data as well as the cell block A or store binary data as well as the cell block C according to the memory application.

Further, as shown in FIGS. 15A, 15B, since the width of the active regions in the plurality of cell blocks A to C is made constant, the fine patterning process condition is set uniform for the whole cell array region and fine memory cells can be realized with high reliability. Further, since the word line pitches in the cell blocks A, B are made equal to one another, row decoders which select and drive the word lines can be arranged with a constant pitch. This is also preferable for the fine patterning process.

Next, a modification of the seventh embodiment is explained.

Figure 20:
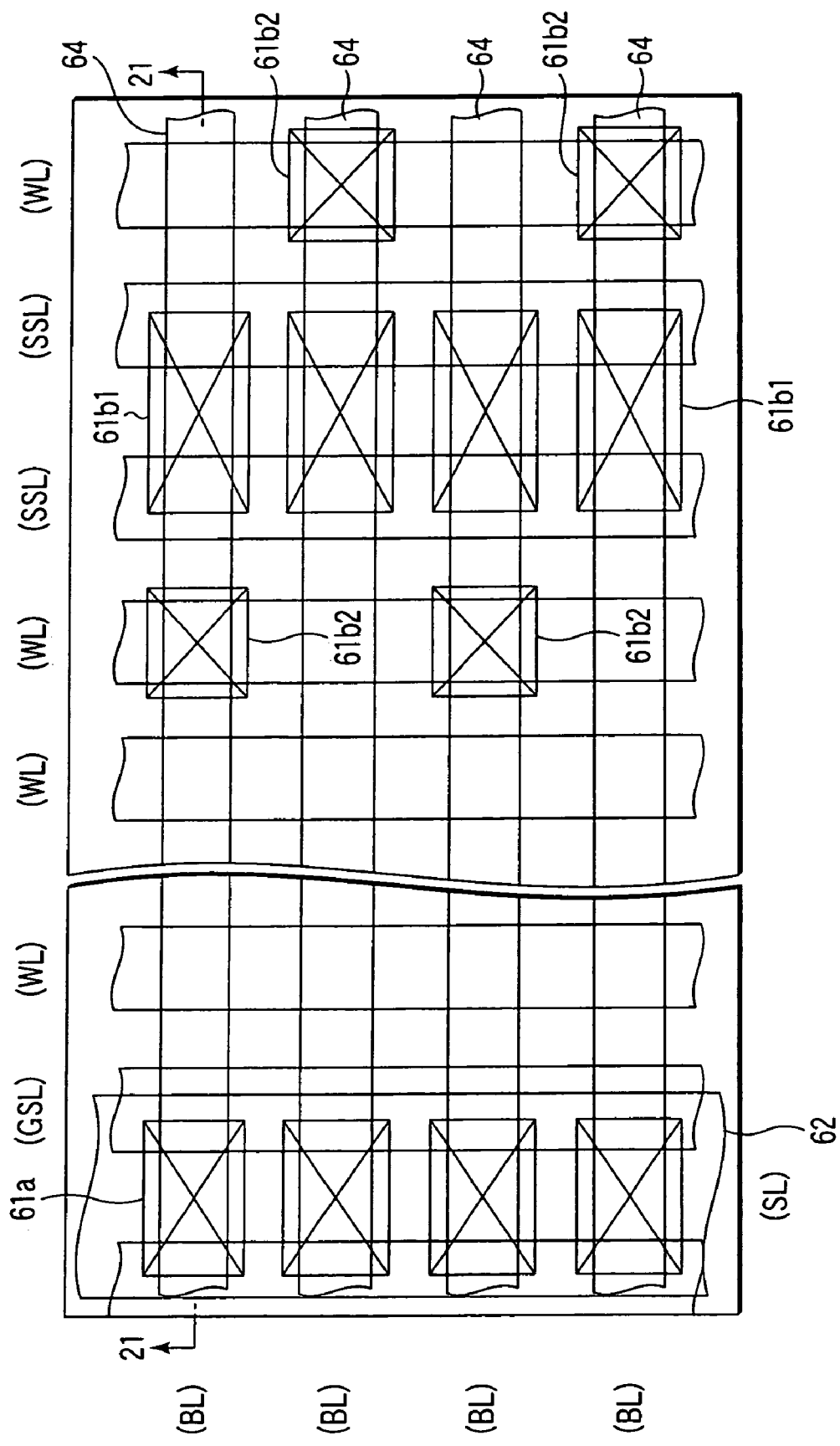
FIG. 20 is a plan view showing a memory cell array of a non-volatile semiconductor memory device according to a first modification of the seventh embodiment.
Figure 21:
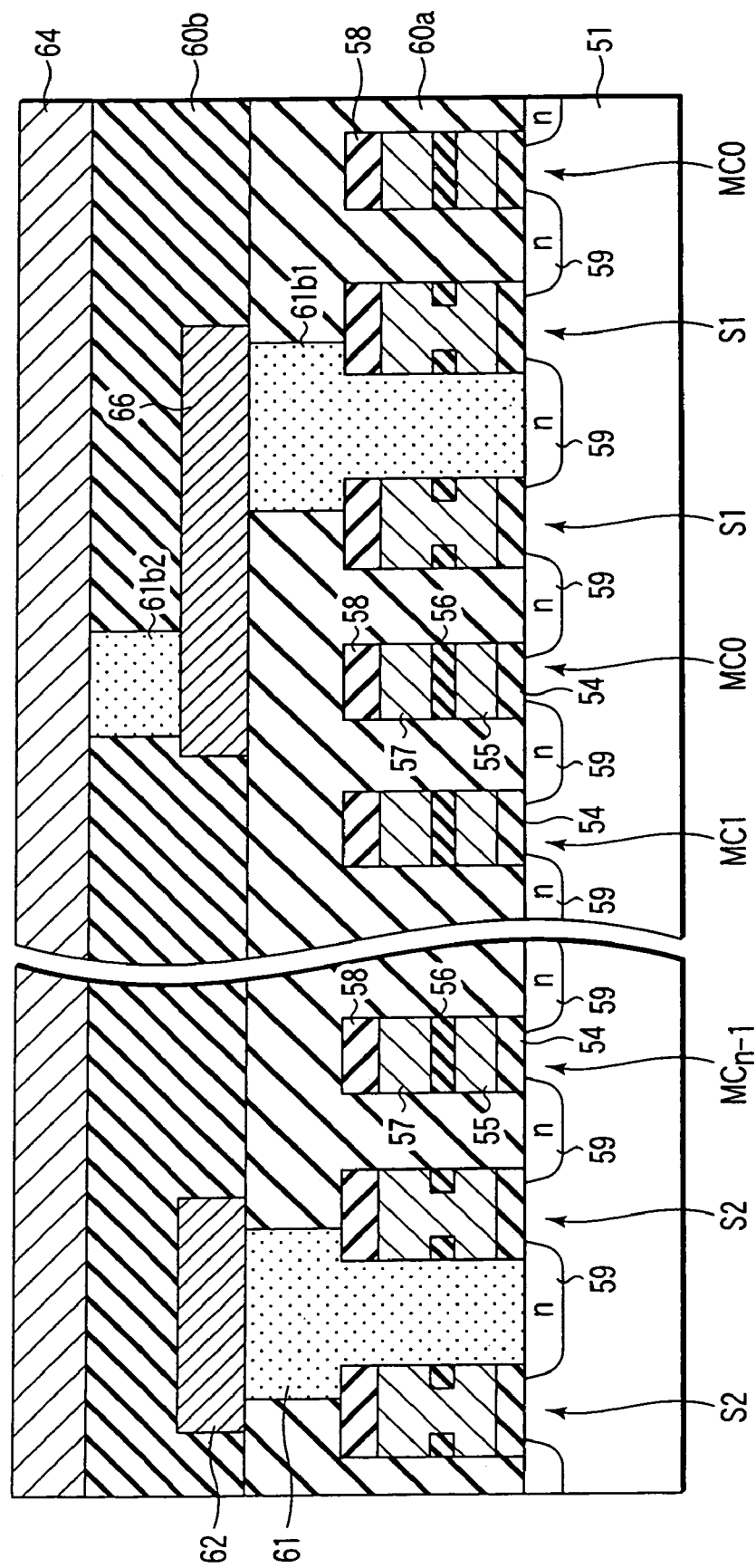
FIG. 21 is a cross sectional view taken along the 21-21 line of FIG. 20.

FIG. 20 is a plan view showing a memory cell array of a non-volatile semiconductor memory device according to a first modification of the seventh embodiment and FIG. 21 is a cross sectional view taken along the 21-21 line of FIG. 20.

In FIGS. 20 and 21, an example in which the configuration of the bit line contact is modified is shown in correspondence to FIGS. 16 and 17. Portions which correspond to those of FIGS. 16 and 17 are denoted by the same reference symbols and the explanation thereof is omitted.

In the first modification, the bit line 64 is connected to the diffusion layer 59 via a junction interconnection 66. The junction interconnection 66 is formed on the first interlayer insulating film 60a by using the same conductor material as the common source line 62. The junction interconnection 66 is connected to the n-type diffusion layer 59 via a contact plug 61b1 embedded in the first interlayer insulating film 60a. The bit line 64 formed on the second interlayer insulating film 60b is connected to the junction interconnection 66 via a contact plug 61b2 embedded in the second interlayer insulating film 60b.

The contact plugs 61b1 each used to connect the junction interconnection 66 to the n-type diffusion layer 59 are embedded in spaces between the gate electrodes of respective two adjacent selection transistors S1 in a self-alignment fashion, formed to partly overlap the above gate electrodes and arranged in a line in the word line direction. As shown in FIG. 20, the contact plugs 61b2 each used to connect the bit line 64 to the junction interconnection 66 are alternately arranged on both sides of the arrangement of the contact plugs 61b1 and are disposed to lie on the word lines. Thus, the arrangement pitch of the contact plugs 61b2 is twice that of the contact plugs 61b1. The above arrangement makes it possible to form the contact plugs 61b2 which are not self-aligned unlike the contact plugs 61b1 to have a certain area without short-circuiting and bring them into contact with the corresponding junction interconnections 66 without fail.

Figure 22:
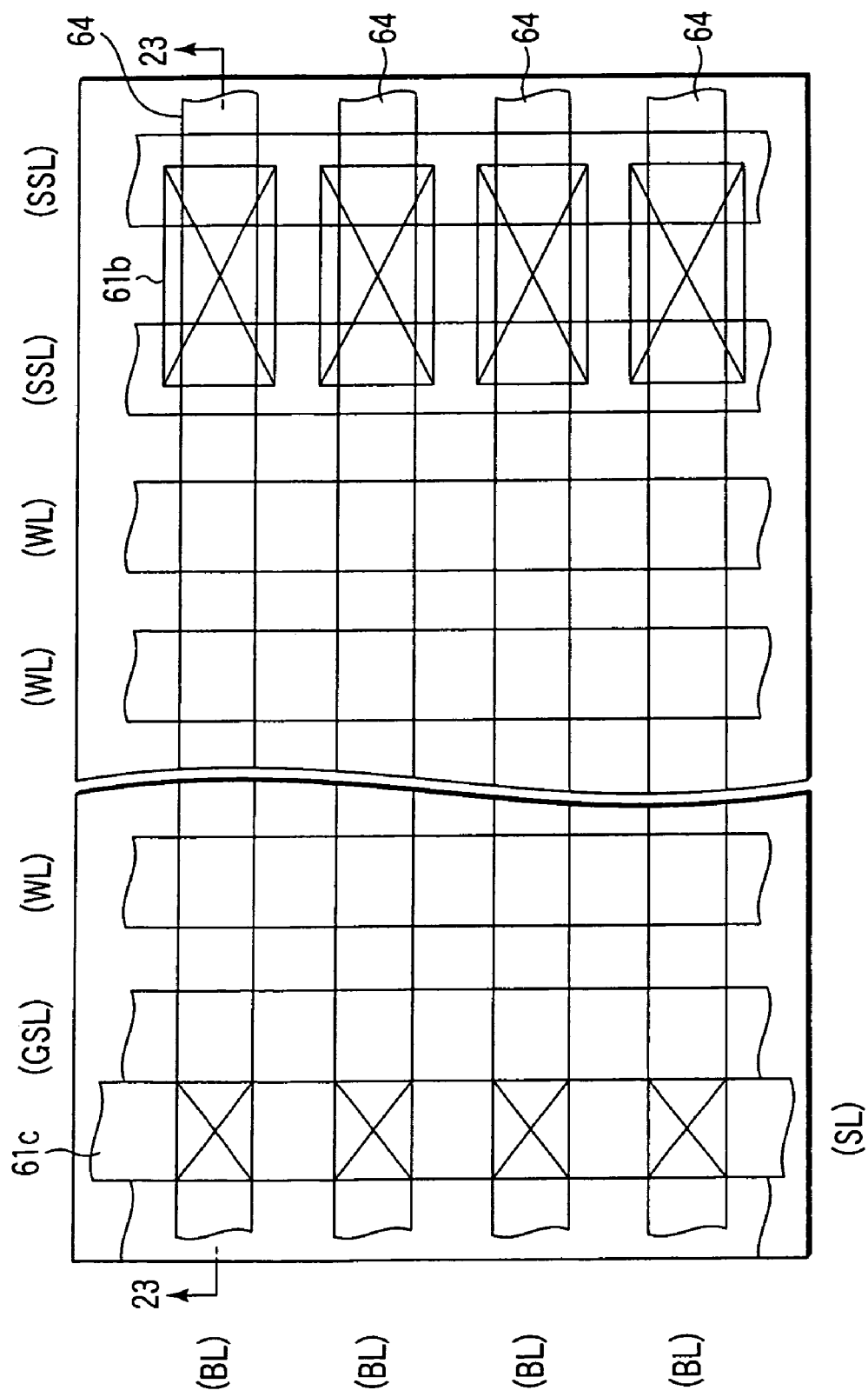
FIG. 22 is a plan view showing a memory cell array of a non-volatile semiconductor memory device according to a second modification of the seventh embodiment.
Figure 23:
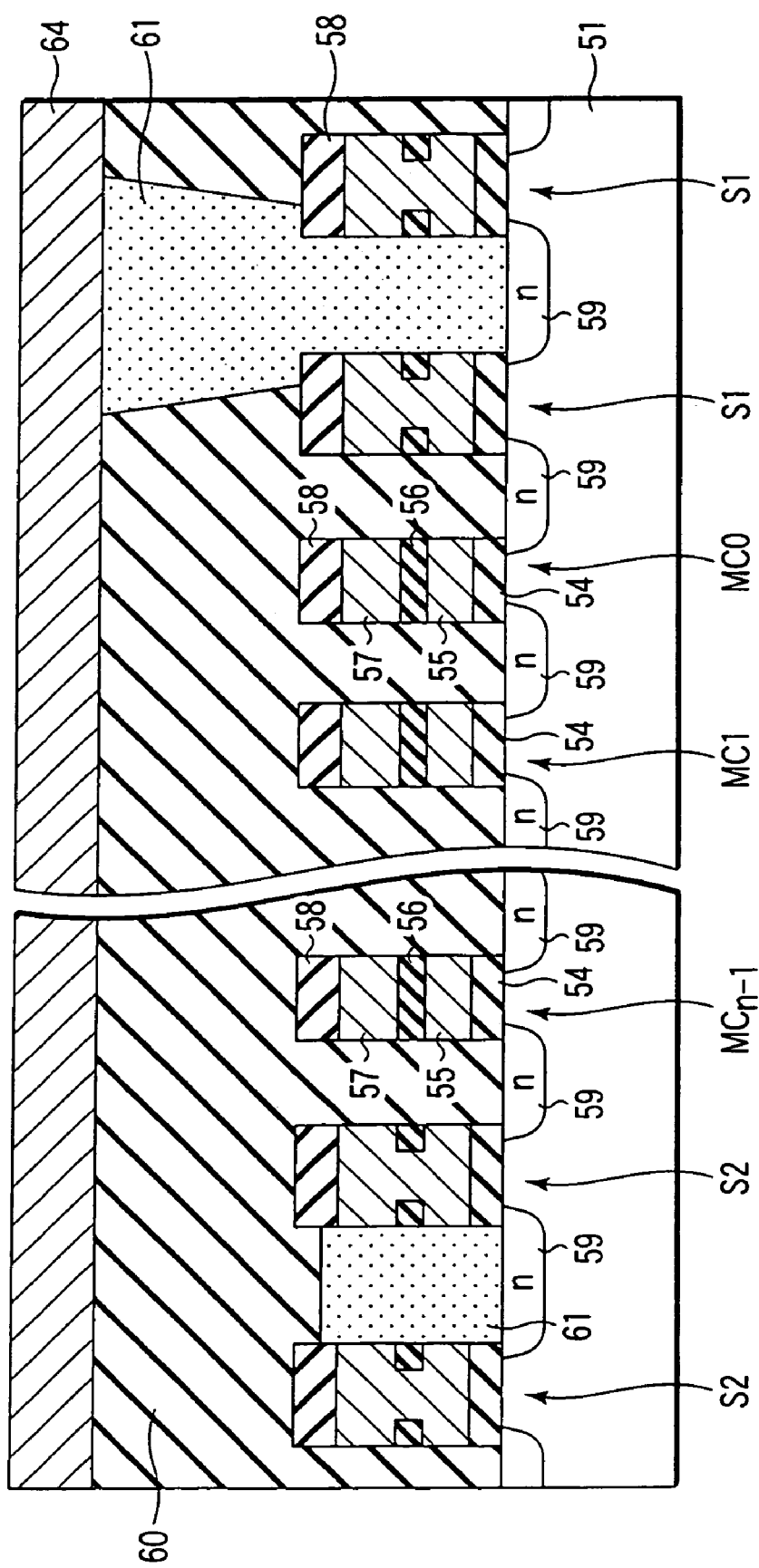
FIG. 23 is a cross sectional view taken along the 23-23 line of FIG. 22.

FIG. 22 is a plan view showing a memory cell array of a non-volatile semiconductor memory device according to a second modification of the seventh embodiment and FIG. 23 is a cross sectional view taken along the 23-23 line of FIG. 22.

In FIGS. 22 and 23, another example in which the configuration of the bit line contact is modified is shown in correspondence to FIGS. 16 and 17. Portions which correspond to those of FIGS. 16 and 17 are denoted by the same reference symbols and the explanation thereof is omitted.

In the second modification, metal interconnections are not used as interconnections corresponding to the common source lines 62 and contact plugs 61a explained with reference to FIGS. 16 and 17 and embedded interconnections 61c formed of metal such as tungsten or polysilicon or the like are used. The embedded interconnections 61c are formed of local inter-connecting interconnections embedded in spaces between the gate electrodes of adjacent selection transistors S2 in a self-alignment fashion and are continuously formed in the word line direction and used as a common source line.

In this case, the interlayer insulating film 60 is formed of one layer and the metal interconnection is only the bit line 64. Like the case of FIGS. 16 and 17, the bit line 64 is connected to the n-type diffusion layer 59 via the contact plug 61b1 embedded in the interlayer insulating film 60. Thus, by reducing the number of metal interconnections, the process can be simplified and the number of manufacturing steps can be reduced.

Figure 24A:
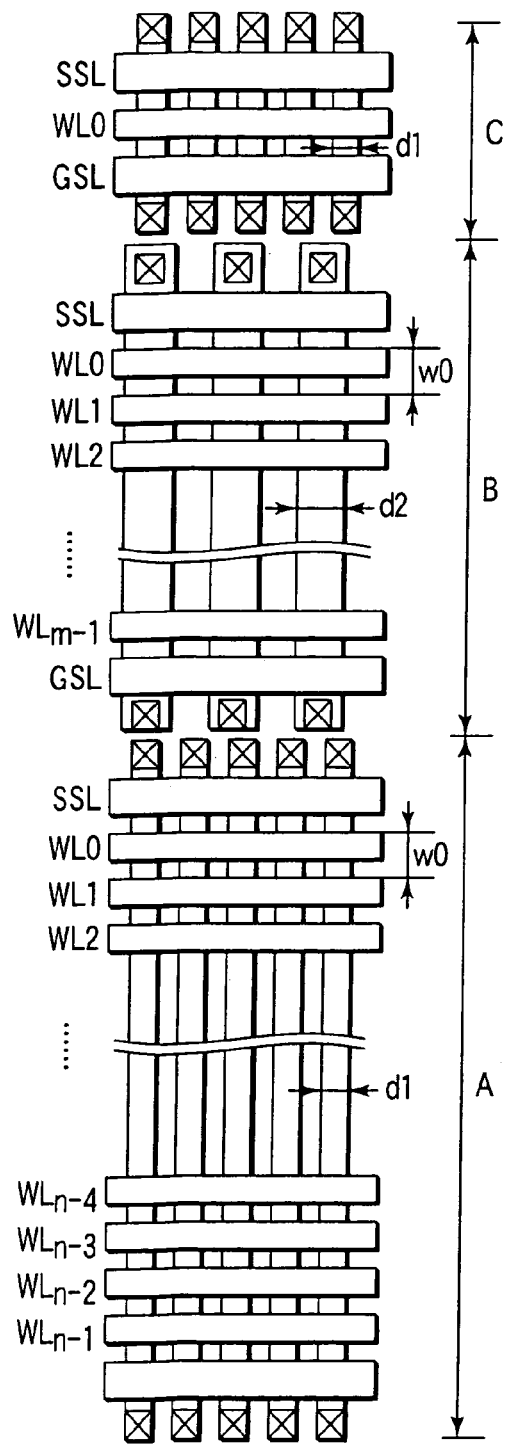
FIG. 24A is a plan view showing a memory cell array of a non-volatile semiconductor memory device according to a third modification of the seventh embodiment.

FIG. 24A is a plan view showing a memory cell array of a non-volatile semiconductor memory device according to a third modification of the seventh embodiment.

FIG. 24A shows an example of the modified layout of the memory cell array in correspondence to FIG. 15.

In the third modification, the widths of active regions (element regions) in a plurality of cell blocks are made different. Specifically, in the third modification, the widths of the active regions of the cell blocks A, C are set to d1 and the width of the active regions of the cell block B is set to d2 larger than d1. Like the case of the seventh embodiment, the word line pitches of the cell blocks A, B are set to the same width w0.

As the concrete cell array configuration, any one of the configuration explained with reference to FIGS. 16 to 18, the configuration explained with reference to FIGS. 20 and 21 and the configuration explained with reference to FIGS. 22 and 23 can be applied except the relation between the widths of the element regions and the element isolation regions.

In the prior art, generally, the floating gate material film is subjected to the slit forming process on the element isolation region in order to divide or isolate the floating gate for each cell in the word line direction. On the other hand, as explained with reference to FIGS. 16 to 18, if a system for embedding the floating gate in a space between the element isolation regions in a self-alignment fashion is used, the relation between the widths of the element regions and the element isolation regions can be freely selected since it is not necessary to form slits.

Like the third modification, if the widths of the element regions are made different between the cell blocks, an optimum characteristic can be selected according to the application of the cell block.

When attention is paid to the two cell blocks A and B in the example shown in FIG. 24A, the width of the active region of the cell block B having the shorter NAND string is made larger than that of the cell block A. That is, the cell block B having the shorter NAND string is more preferable for the high speed operation than the cell block A, but it is preferable to make the width of the active region larger and acquire a larger current in order to further enhance the high speed performance of the cell block B.

Figure 25A:
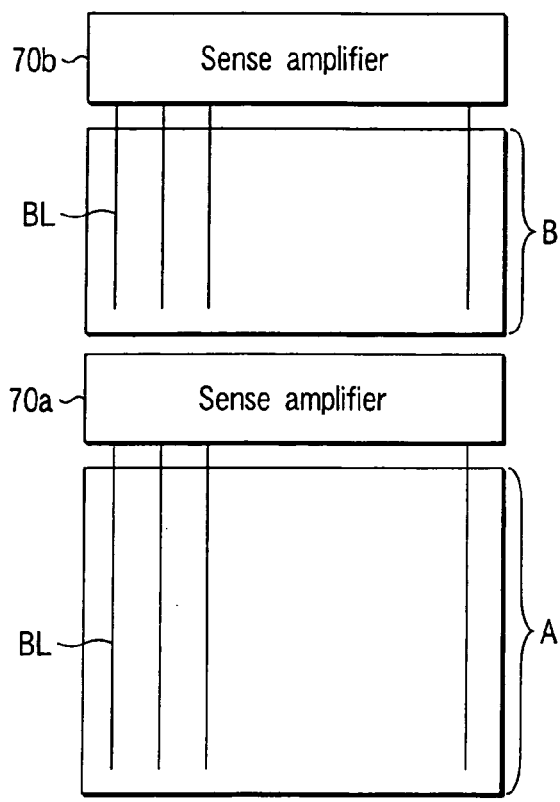
FIG. 25A is a plan view showing a layout example of a memory cell array and sense amplifier of the non-volatile semiconductor memory device according to third modification of the seventh embodiment.

As shown in FIG. 24A, particularly, if the pitches become larger when the widths of the element regions are made different between the cell blocks A, B, it becomes difficult to continuously form the bit lines BL in the cell blocks A, B. Therefore, in this case, the bit lines BL are independently arranged at different pitches for the respective cell blocks A, B. Further, in this case, as shown in FIG. 25A, sense amplifiers 70a, 70b are independently arranged for the respective cell blocks A, B.

Figure 24B:
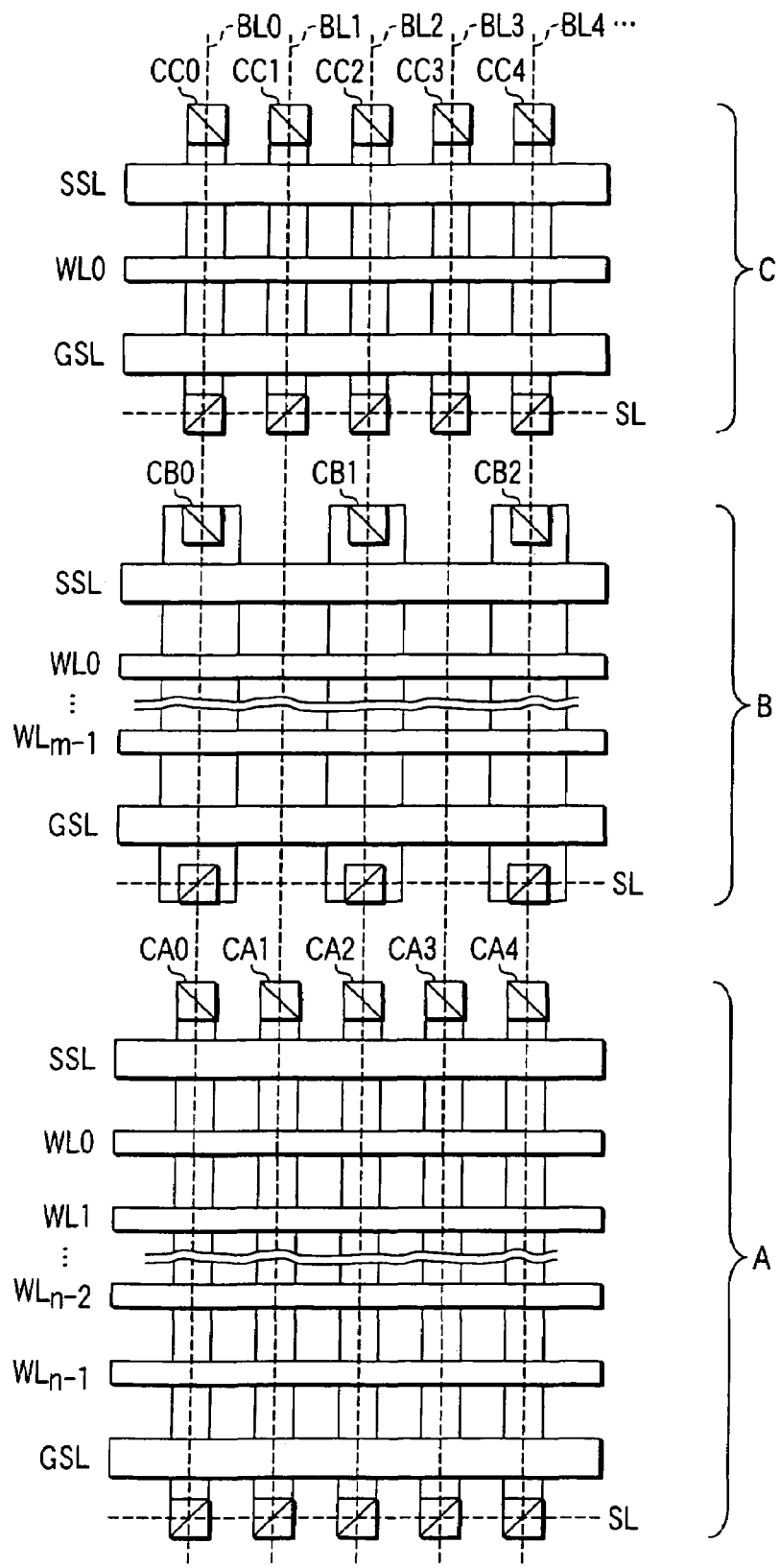
FIG. 24B is a plan view showing a memory cell array of a non-volatile semiconductor memory device according to a fourth modification of the seventh embodiment.

FIG. 24B is a plan view showing the memory cell array of a nonvolatile semiconductor memory that is the fourth modification of the seventh embodiment of this invention.

FIG. 24B shows an example of the modified layout of the memory cell array in correspondence to FIG. 15.

In the fourth modification, the active region of the cell block B is different in width from the active regions of the cell blocks A and C, as in the third modification. The fourth modification is different from the third modification in that the cell bocks A, B and C share bit lines BL (only bit lines BL0 to BL4 are shown).

The active region of the cell block B is broader than those of the cell blocks A and C in the fourth modification. Hence, the even-numbered bit lines, i.e., lines BL0, BL2 and BL4, are connected to the NAND string that is provided in the cell block B.

Figure 25B:
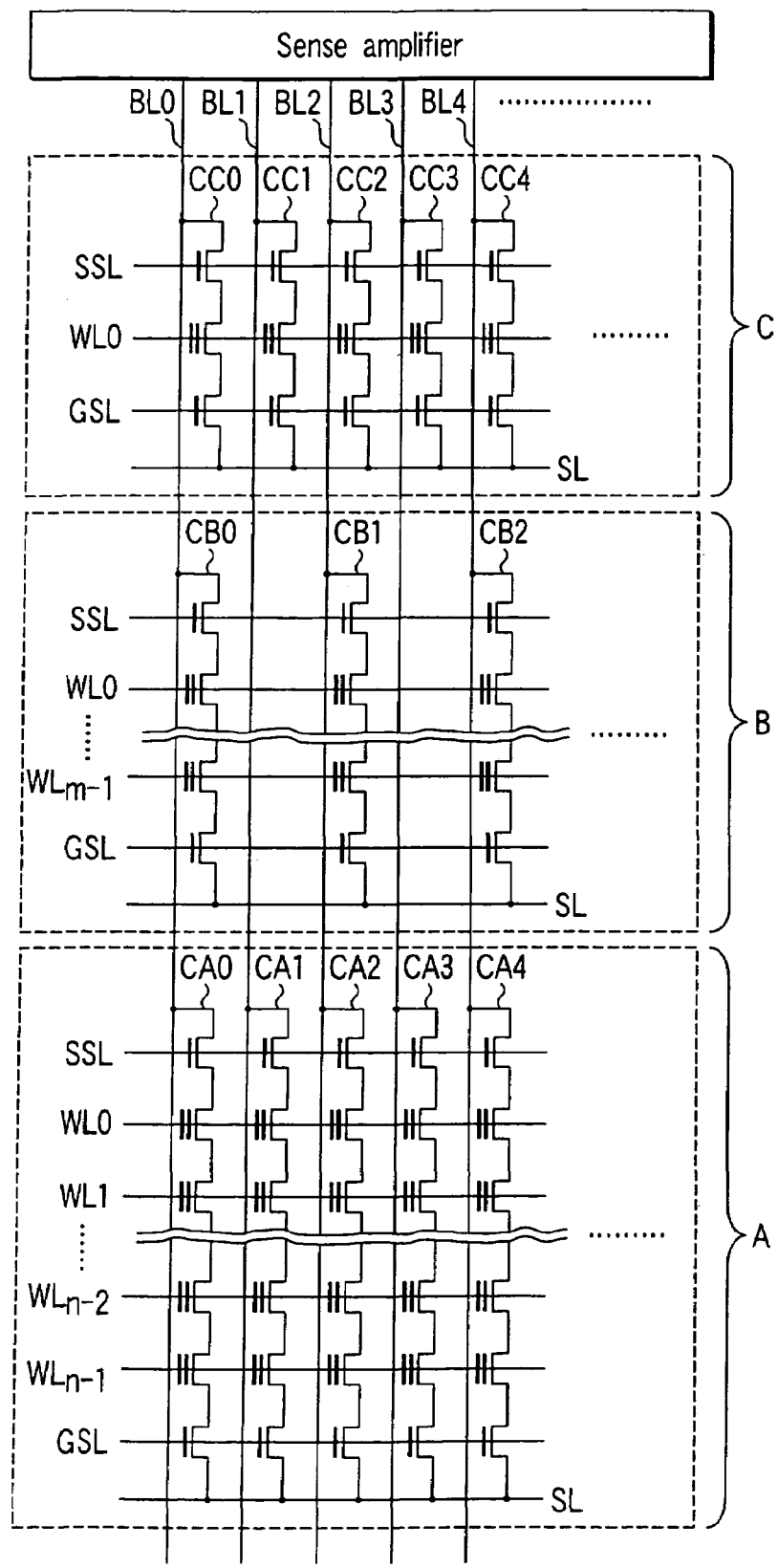
FIG. 25B is a plan view showing a layout example of a memory cell array and sense amplifier of the non-volatile semiconductor memory device according to fourth modification of the seventh embodiment.

More precisely, the bit lines BL0, BL2 and BL4 are connected to the NAND string provided in the cell block A, by bit-line contacts CA0 to CA4 connect. They are connected to the three-transistor cells of the cell block C, too, by bit-line contacts CC0 to CC4. Of the bit lines BL0 to BL4, the lines BL0, BL2 and BL4 are connected to the NAND string incorporated in the cell block B, by bit-line contacts CB0 to CB2, whereas the odd-numbered bit lines, i.e., line BL1 and BL3, extend through the cell block B. FIG. 25B depicts the layout of the memory cell array and sense amplifier of the fourth modification of the seventh embodiment. FIG. 25B is an equivalent circuit diagram of that part of the fourth modification that is illustrated in FIG. 24B.

In the cell block B that has a broader active region than the cell blocks A and C, the even-numbered bit lines contact the NAND string and the odd-numbered bit line extend through the cell block B. This enables the cell blocks A, B and C to share the bit lines and, ultimately, to share a sense amplifier.

In the fourth modification of the seventh embodiment, the bit lines are arranged in the cell block B at the same pitch as in the cell blocks A and C. The fourth embodiment, which is a microelectronic device, can be manufactured more easily than otherwise.

In the fourth modification, the even-numbered bit lines, or half (½) of all bit lines, contact the NAND string provided in the cell block B. Nonetheless, a quarter (¼), an eighth (⅛) or the like of all bit lines may contact the NAND string incorporated in the cell block B. For example, the bit lines BL0 and BL4 contact the NAND string, and the other bit lines BL1, BL2 and BL3 extend through the cell block B.

The NAND string in the cell block B is shorter than the NAND block provided in the cell block A, in the fourth modification of the seventh embodiment. Nevertheless, the NAND string may have the same length as the NAND string incorporated in the cell block A.

As indicated above, the active region of the cell block B has a width different from those of the cell blocks A and C in the fourth modification. Instead, the active region of, for example, the cell block C may be narrower or broader than those of the cell blocks A and B.

Eighth Embodiment

Recently, nonvolatile semiconductor memories have come into use as main memories in IC cards such as memory cards. A typical memory card includes a main memory and a controller that controls the main memory. A memory card of this type is a card-type package containing two IC chips, i.e., a controller IC chip and a memory IC chip, as is disclosed in, for example, reference document 12.

Reference Document 12:

Shigeo Araki, "The Memory Stick," Shigeo Araki, http://www.ece.umd.edu/courses/enee759 m,S2002/papers/araki-micro20-4.pdf pp. 40-46.

Since the card-type package contains both the controller IC chip and the memory IC chip, it is difficult to manufacture the memory card small or lower the manufacturing cost thereof. To solve this problem, it is desired that the controller and the main memory be provided in the form of a single chip.

Figure 26B:
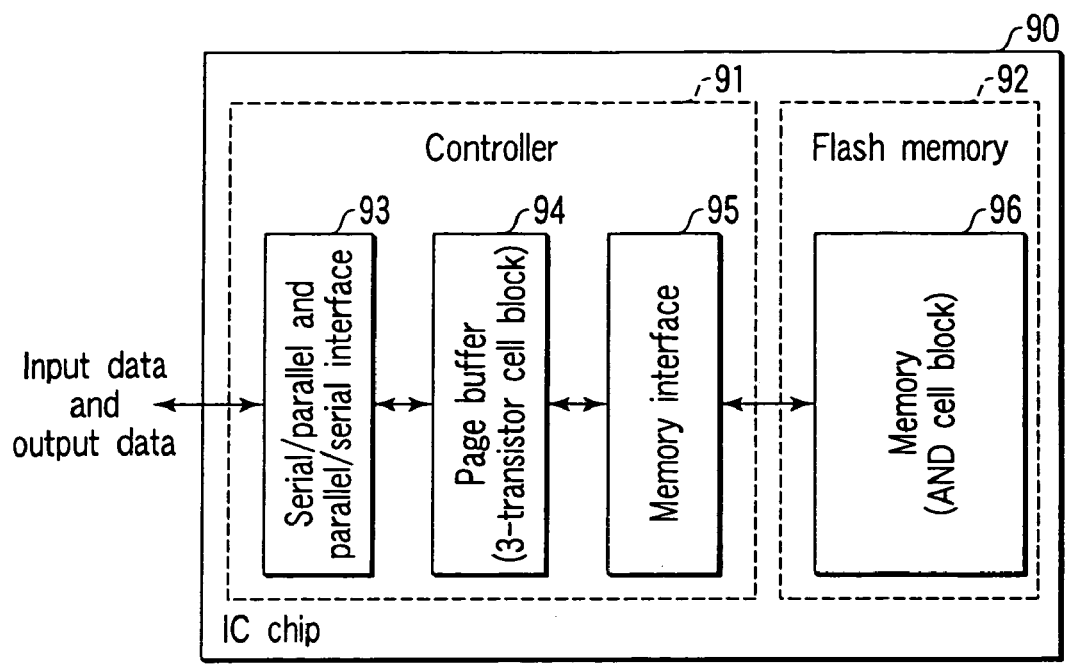
FIG. 26B is a block diagram showing a non-volatile semiconductor memory device according to a second example of the eighth embodiment of the present invention.
Figure 26C:
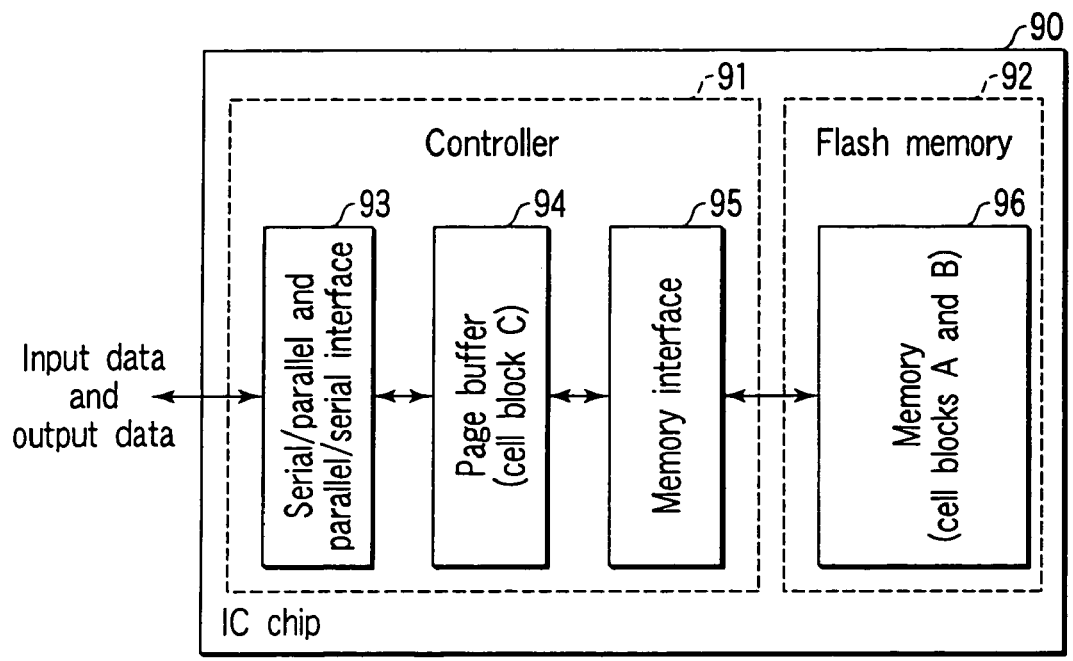
FIG. 26C is a block diagram showing a non-volatile semiconductor memory device according to a third example of the eighth embodiment of the present invention.
Figure 28:
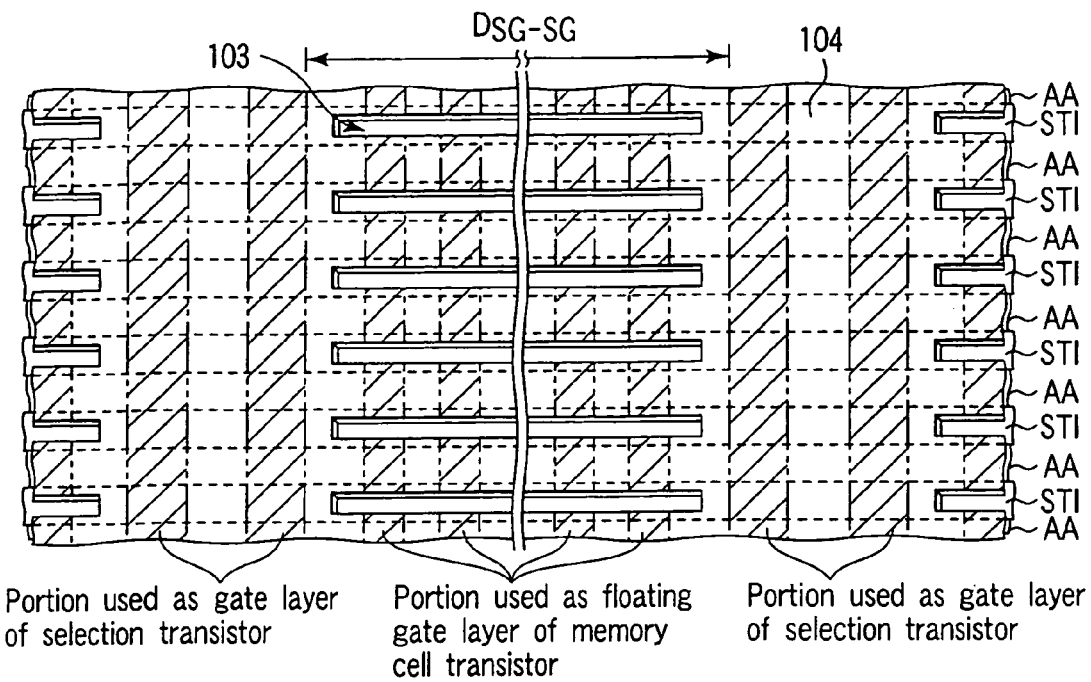
FIG. 28 is a plan view showing a step in which slits of a conventional non-volatile semiconductor memory device are formed.
Figure 29:
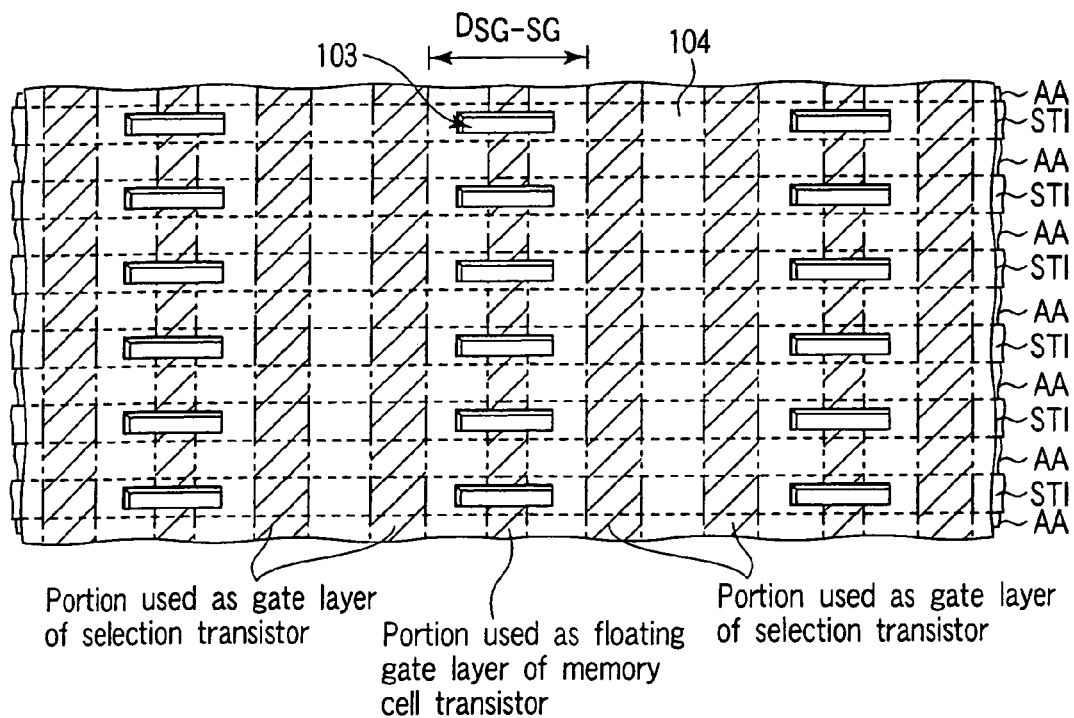
FIG. 29 is a plan view showing a step in which slits of another conventional non-volatile semiconductor memory device are formed.

FIGS. 26A to 26C are block diagrams illustrating nonvolatile semiconductor memories that are the eighth embodiment of the present invention.

FIG. 26A shows a first example of the eighth embodiment, which is an IC chip 90. As seen from FIG. 26A, the IC chip 90 includes two function blocks. The first function block is a main memory, such as a flash memory 92. The second function block is a controller 91 for controlling the flash memory 92. The controller 91 comprises various circuit blocks. Of the circuit blocks, only those that are related to the main memory will be described with reference to FIG. 26A.

Among the circuit blocks related to the main memory are the serial/parallel and parallel/serial interface 93, page buffer 94 and memory interface 95.

The serial/parallel and parallel/serial interface 93 converts serial input data to parallel internal data so that the input data may be written into the flash memory 92. The parallel internal data, thus generated, is input to the page buffer 94 and stored therein. The internal data stored in the page buffer 94 is written into the flash memory 92 through the memory interface 95.

To read the data from the IC chip 90, the data read from the flash memory 92 is input to the page buffer 94 through the memory interface 95 and stored in the page buffer 94. The internal data stored in the page buffer 94 is input to the serial/parallel and parallel/serial interface 93. The interface 93 converts the internal data (i.e., parallel data) to output data (i.e., serial data). The output data is supplied from the IC chip 90.

As FIG. 27 shows, the IC chip 90 is incorporated in, mounted on or bonded to a card-type package 97. The IC chip 90 and the card-type package 97 constitute an IC card, such as a memory card.

In the first example of the eighth embodiment, shown in FIG. 26A, the memory cell array of the flash memory 92 is a NAND cell block 96, and the page memory 94 is a three-transistor cell block of the type described above.

FIG. 26B depicts a second example of the eighth embodiment, which is an IC chip 90, too. The second example differs from the first example (FIG. 26A) in one respect. That is, the flash memory 92 is an AND cell block 96 of the type described above. Note that the page buffer 94 is a three-transistor cell block as in the first example.

FIG. 26C shows a third example of the eighth embodiment, which is an IC chip 90, too. The third example differs from the first and second examples in two respects. First, the cell array of the flash memory 92 includes cell blocks A and B of the type employed in the seventh embodiment. Second, the page buffer 94 comprises a cell block C of the type incorporated in the seventh embodiment.

As indicated above, the eighth embodiment is an IC chip 90 that contains a controller 91 and a flash memory 92 (i.e., main memory). In the eighth embodiment, the flash memory 92 comprises either a NAND cell block or an AND cell block, and the page buffer 94 comprises a three-transistor cell block. The NAND cell block, the AND cell block, and three-transistor cell block comprise memory cells of the same type. This renders it easy to manufacture the IC chip 90.

Moreover, the page buffer 94 can be constituted by fewer transistors than in the case where it is a latch circuit that is made of two CMOS-type inverters.

In the eighth embodiment, the page buffer 94 may be a two-transistor cell block of the type described above.

Further, the memory cell array of the flash memory 92 may include a three-transistor cell block, a two-transistor cell block, and a NAND cell block. Alternatively, it may include cell blocks A, B and C of the types incorporated in the seventh embodiment.

As described above, according to the present invention, a NAND EEPROM which is designed to simultaneously attain the large memory capacity caused by high density and the high-speed performance and high reliability can be attained.

The present invention has been explained by use of the first to seventh embodiments, but the present invention is not limited to the above embodiments, and when the present invention is carried out, the present invention can be variously modified without departing from the technical scope thereof.

Further, the above embodiments can be independently carried out, but it is of course possible to adequately combine and carry out the embodiments.

In the above embodiments, inventions at various stages are contained and the inventions at various stages can be extracted by adequately combining a plurality of constituents disclosed in each of the embodiments.

In addition, the above embodiments are explained based on the examples in which the present invention is applied to the non-volatile semiconductor memory device, but a semiconductor integrated circuit device such as a processor, system LSI or the like which includes the non-volatile semiconductor memory device can be contained in the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory card comprising:
   a flash memory block including
      a memory cell array having
         a first cell block provided in the memory cell array with a plurality of memory cell strings each of which is configured by a plurality of electrically rewritable memory cells and at least one selection transistor which are serially connected being arranged in the first cell block, and
         a second cell block provided in the memory cell array with a plurality of memory cell strings each of which is configured by a plurality of electrically rewritable memory cells different in number from those of the first cell block and at least one selection transistor which are serially connected being arranged in the second cell block, widths of element regions of the memory cell strings of the first cell block being different from those of the second cell block; and
   a controller block which controls the flash memory block, the controller block managing data transfer between the flash memory block and an outside.

2. The memory card according to claim 1, wherein the controller block includes:
   a first interface which communicates with the outside, and
   a second interface which communicates with the flash memory block.

3. The memory card according to claim 1, wherein the controller block further includes a page buffer,
   the page buffer stores data input from the first interface and transfers the data to the second interface, and
   the page buffer stores data input from the second interface and transfers the data to the first interface.

4. The memory card according to claim 1, wherein the first interface includes a serial/parallel and parallel/serial interface,
   the second interface includes a memory interface,
   the serial/parallel and parallel/serial interface converts externally input serial data to parallel data and converts parallel data input from the page buffer to serial data, and
   the parallel data converted by the serial/parallel and parallel/serial interface is stored in the page buffer and is written into the flash memory block through the memory interface.

5. A memory card comprising:
   a flash memory block including
      a memory cell array having
         a first cell block provided in the memory cell array with a plurality of memory cell strings each of which is configured by a plurality of electrically rewritable memory cells and at least one selection transistor which are serially connected being arranged in the first cell block, and
         a second cell block provided in the memory cell array, a plurality of memory cell strings each of which is configured by a plurality of electrically rewritable memory cells different in number from those of the first cell block and at least one selection transistor which are serially connected being arranged in the second cell block; and a third cell block provided in the memory cell array, a plurality of memory cell strings each of which is configured by a plurality of electrically rewritable memory cells different in number from those of the first and second cell blocks and at least one selection transistor which are serially connected being arranged in the second cell block; and
   a controller block which controls the flash memory block, the controller block managing data transfer between the flash memory block and an outside.

6. The memory card according to claim 5, wherein the controller block includes:
   a first interface which communicates with the outside, and
   a second interface which communicates with the flash memory block.

7. The memory card according to claim 6, wherein the controller block further includes a page buffer,
   the page buffer stores data input from the first interface and transfers the data to the second interface, and
   the page buffer stores data input from the second interface and transfers the data to the first interface.

8. The memory card according to claim 6, wherein the first interface includes a serial/parallel and parallel/serial interface,
   the second interface includes a memory interface,
   the serial/parallel and parallel/serial interface converts externally input serial data to parallel data and converts parallel data input from the page buffer to serial data, and
   the parallel data converted by the serial/parallel and parallel/serial interface is stored in the page buffer and is written into the flash memory block through the memory interface.

9. A memory card comprising:
a flash memory block including
a memory cell array having
a first cell block provided in the memory cell array with a plurality of memory cell strings each of which is configured by a plurality of electrically rewritable memory cells and at least one selection transistor which are serially connected being arranged in the first cell block,
and a second cell block provided in the memory cell array with a plurality of memory cell strings each of which is configured by a plurality of electrically rewritable memory cells different in number from those of the first cell block and at least one selection transistor which are serially connected being arranged in the second cell block, one of the first and second cell blocks in which the number of memory cells of the memory cell string is smaller performing a binary data storage operation, the other of the first and second cell blocks in which the number of memory cells of the memory cell string is larger performing a multi-value data storage operation; and
a controller block which controls the flash memory block, the controller block managing data transfer between the flash memory block and an outside.

10. The memory card according to claim 9, wherein the controller block includes:
a first interface which communicates with the outside, and
a second interface which communicates with the flash memory block.

11. The memory card according to claim 10, wherein the controller block further includes a page buffer,
the page buffer stores data input from the first interface and transfers the data to the second interface, and
the page buffer stores data input from the second interface and transfers the data to the first interface.

12. The memory card according to claim 10, wherein the first interface includes a serial/parallel and parallel/serial interface,
the second interface includes a memory interface,
the serial/parallel and parallel/serial interface converts externally input serial data to parallel data and converts parallel data input from the page buffer to serial data, and
the parallel data converted by the serial/parallel and parallel/serial interface is stored in the page buffer and is written into the flash memory block through the memory interface.

* * * * *